United States Patent
Nakajima

[11] Patent Number: 6,147,936
[45] Date of Patent: Nov. 14, 2000

[54] ELECTRONIC WATCH

[75] Inventor: Fumio Nakajima, Tokyo, Japan

[73] Assignee: Citizen Watch Co., Ltd., Tokyo, Japan

[21] Appl. No.: 09/101,029

[22] PCT Filed: Oct. 31, 1997

[86] PCT No.: PCT/JP97/03996

§ 371 Date: Jun. 26, 1998

§ 102(e) Date: Jun. 26, 1998

[87] PCT Pub. No.: WO98/19221

PCT Pub. Date: May 7, 1998

[30] Foreign Application Priority Data

Oct. 31, 1996 [JP] Japan .................................. 8-289925

[51] Int. Cl.[7] .................................................. G04B 1/00
[52] U.S. Cl. ........................... 368/205; 368/204; 368/66
[58] Field of Search .................................. 368/203, 204, 368/205, 66

[56] References Cited

U.S. PATENT DOCUMENTS

| | | | |
|---|---|---|---|
| 5,699,322 | 12/1997 | Born | 368/66 |
| 5,790,478 | 8/1998 | besson | 368/66 |
| 5,828,628 | 10/1998 | born et al. | 368/66 |

FOREIGN PATENT DOCUMENTS

| | | |
|---|---|---|
| 54-8970 | 6/1952 | Japan . |
| 56-66783 | 6/1981 | Japan . |
| 57-67880 | 4/1982 | Japan . |
| 60-170790 | 11/1985 | Japan . |
| 60-230086 | 11/1985 | Japan . |
| 62-176792 | 11/1987 | Japan . |
| 64-81626 | 3/1989 | Japan . |
| 4-357480 | 12/1992 | Japan . |
| 4-363678 | 12/1992 | Japan . |
| 5-197224 | 8/1993 | Japan . |

*Primary Examiner*—Bernard Roskoski
*Attorney, Agent, or Firm*—Armstrong, Westerman, Hattori, McLeland & Naughton

[57] ABSTRACT

In an electronic watch provided with an electric power generator (1) for generating power from external energy and charge means (3) for charging power generated by the electric power generator (1), clock means (4) executes time display operation by power of the electric power generator (1) or charge means (3) and produces a count pulse (S10) for counting the amount of power stored in the charge means (3) and a charge monitoring means (6) counts the amount of stored power of the charge means (3) in response to the count pulse (S10) and displays the amount of stored power based on the counted value.

5 Claims, 15 Drawing Sheets

ELECTRONIC WATCH

TECHNICAL FIELD

The present invention relates to an electronic watch provided with an electric power generator for generating power by utilizing externally available environmental energy, and charge means for storing electric energy generated by the electric power generator, that is operated by the power (electric energy), or an electronic watch that is operated by the power of a power supply cell serving as a primary cell or a secondary cell, particularly to an electronic watch capable of monitoring the amount of power of the charge means or the power supply cell.

BACKGROUND TECHNOLOGY

As a conventional electronic watch, there are electronic watches provided with a built-in electric power generator for converting external energy such as photovoltaic energy, thermal energy, mechanical energy, and the like into electric energy (generation of power), and driving watch means by this electric energy, thereby executing time display operation.

In an electronic watch having a primary cell such as a silver cell or a lithium cell as a power supply, there is generally provided means for monitoring the amount of power stored in the power supply cell, for example, when a cell voltage is detected and the detected cell voltage falls to a value lower than a given value, hands such as a second hand of the time display means are caused to do a special hand operation such as two-second hand operation which is different from the normal hand operation, thereby facilitating the replacement of the cell.

Further, in an electronic watch having a power supply which is obtained by converting external energy into power, and charging the power in a capacitor having large capacity such as an electronic double-layer capacitor, the charging voltage is detected, and then a second hand is fast forwarded in response to the detected voltage value, thereby generally displaying an operable time of the watch by the amount of forward motion of the second hand.

In such conventional electronic watches, the cell voltage or the charging voltage is detected to display a lowering of the voltage. Accordingly, it is impossible to exactly know the amount of stored power.

For example, in the case of an electronic watch having a silver cell as a power supply, discharging characteristics of the silver cell are as shown in a graph in FIG. 17, wherein a curve E showing the cell voltage always represents a constant voltage value of 1.5 volts during 1 to 2 years. However, the amount of stored electric charge is largely reduced as shown by a curve Q. Accordingly, it is not possible to determine the stored power of the silver cell from the cell voltage until the life of the cell almost expires.

The amount of stored power cannot be conjectured by detecting the cell voltage until the life of the cell almost expires to lower the cell voltage to about 1.3 volts. However, as shown in FIG. 17, the quantity Q32 of electric charge at that time is very small, and the amount of stored power which is the product of the quantity Q of electric charge and the power supply voltage E is very small to the extent that the electronic watch operates only for a further couple of days.

Accordingly, the stored power becomes less sooner than the operating voltage of the electronic watch indicates, namely V32=0.9 volt, and hence users have little time to replace the cell, so that the electronic watch inconveniently stops.

In an electronic watch for converting external energy into power for charging the power in a capacitor having large capacity, the amount of charged power is considered to be proportional to the capacity value of the large capacitor times the charging voltage squared, and hence it is possible to conjecture the charging capacity from the charging voltage. However, the operable time of the electronic watch can be known as a general rule.

Although it is not impossible to determine the amount of stored power by use of an operation circuit including a multiplier, it requires a complex circuit arrangement and the power consumption increases, which is not practical for a wrist watch. Even in this case, since the operable time of the electronic watch can be detected for only several tens of hours before power exhaustion at the most, it is necessary for users to quickly charge the cell when the electronic watch stops.

The present invention has been made to improve upon the problems set forth above, and it is an object of the present invention to provide an electronic watch capable of always exactly monitoring the amount of stored power of the charging means or power supply cell thereof.

DISCLOSURE OF THE INVENTION

To achieve the above object, an electronic watch of the present invention counts the amount of stored power of the power supply cell to display thereof.

That is, the electronic watch comprises an electric power generator for generating power by external energy and charge means for charging power which is generated by the electric power generator, and it is operated by the power of the electric power generator or charge means, wherein it further comprises clock means for executing time display operation and generates a count pulse so as to count the amount of stored power of the charge means, and charge monitoring means for counting the amount of stored power of the charge means in response to the count pulse from the clock means to display the counted amount of stored power.

In more detail, the clock means executes time display operation by power of the generator or charge means, and generates a first count pulse so as to count the amount of power generated by the electric power generator, a second count pulse for counting the amount of power consumed by the charge means, a display pulse for displaying the amount of stored power of the charge means, and a switching signal pulse for switching between the first and second count pulses.

The switching means comprises a voltage detector for detecting the power supply voltage of the electric power generator and the charging voltage of the charge means, a pulse controlling circuit for controlling the switching signal pulse in response to an output of the voltage detector, and a pulse selecting circuit for selecting either of the first or second count pulses in response to an output of the pulse controlling circuit.

The aforementioned charge monitoring means is controlled by the output of the pulse controlling circuit of the switching means for counting the amount of stored power of the charge means in response to a count pulse selected by the pulse selecting circuit so as to display the amount of stored power in response to the counted value and the displayed pulse.

The charge monitoring means in this case comprises:
  a count controlling circuit composed of a first counting circuit having a clock input terminal for receiving the count pulse selected by the pulse selecting circuit of the switching means so as to execute a count-up operation or count-down operation in response to the output of the pulse controlling circuit, a second counting circuit for executing a count-up operation or count-down operation so as to produce a counted value which is equal to the counted value of the first counting circuit, and a magnitude comparator for comparing the magnitude of the counted value of the first counting circuit with that of the second counting circuit and outputting the result of comparison;

an operation switching circuit for switching between the count-up operation and count-down operation of the second counting circuit in response to the result of comparison of the magnitude comparator;

a pulse supplying circuit for supplying the display pulse to a clock input terminal of the second counting circuit in response to the result of comparison of the magnitude comparator;

a pulse generating circuit for generating a driving pulse in response to the result of comparison of the magnitude comparator and the display pulse; and, a display mechanism which is driven by the driving pulse to display the amount of stored power of the charge means.

The aforementioned display mechanism comprises a pulse motor which is driven by the driving pulse and a discoid display plate which is rotatably driven by the pulse motor, and wherein the display plate can use a half semicircular portion and another half semicircular portion which are colored with different colors.

Alternatively, even if the clock means does not produce the display pulse, the charge monitoring means is controlled by the output of the pulse controlling circuit of the switching means for counting the amount of stored power of the charge means in response to the count pulse selected by the pulse selecting circuit so as to display the amount of stored power of the charge means in response to the counted value.

The charge monitoring means in this case comprises:

a display unit for digitally displaying the amount of stored power of the charge means, a counting circuit for receiving the count pulse selected by the pulse selecting circuit at its clock input terminal to execute a count-up operation or count-down operation in response to the output of the pulse controlling circuit, thereby outputting the result of count as a binary output, a code converting circuit for converting the binary output value of the counting circuit into a code capable of being digitally displayed, and a display driving circuit for driving a display unit in response to the code converted by the code converting circuit to execute a digital display.

In the electronic watch of the present invention which is operated by power of a power supply cell, clock means executes a time display operation by the power of the power supply cell and generates a count pulse for counting the amount of stored power of the power supply cell, and power supply monitoring means counts the amount of stored power of the power supply cell in response to the count pulse so as to display the counted amount of stored power.

The power supply monitoring means in this case comprises a display unit for digitally displaying the amount of stored power of the power supply cell, a counting circuit for counting the count pulse and outputting the result of counting as a binary output, a code converting circuit for converting the binary output value of the counting circuit into a code capable of being digitally displayed, and a display driving circuit for driving a display unit in response to the code converted by the code converting circuit to execute a digital display.

Alternatively, the clock means produces a display pulse for displaying the amount of stored power of the power supply cell and the power supply monitoring means may include display means for counting the amount of stored power of the power supply cell in response to the count pulse and displays the amount of stored power in response to the counted value and the display pulse.

The power supply monitoring means in this case may comprise:

a count controlling circuit composed of a first counting circuit having a clock input terminal for receiving the count pulse so as to execute a count-down operation and a set input terminal for receiving a set signal so as to be set to a given counting value, a second counting circuit for executing a count-up operation or count-down operation so as to produce a counted value which is equal to the counted value of the first counting circuit, and a magnitude comparator for comparing the magnitude of the counted value of the first counting circuit with that of the second counting circuit and outputting the result of comparison;

an operation switching circuit for switching between the count-up operation and count-down operation of the second counting circuit in response to the result of comparison of the magnitude comparator;

a pulse supplying circuit for supplying the display pulse to a clock input terminal of the second counting circuit in response to the result of comparison of the magnitude comparator;

a pulse generating circuit for generating a driving pulse in response to the result of comparison of the magnitude comparator and the display pulse; and a display mechanism which is driven by the driving pulse to display the amount of stored power of the power supply cell.

The display mechanism in this case can use a display plate which rotatably driven by the pulse motor.

BEST MODE FOR CARRYING OUT THE INVENTION

The embodiments of the present invention will now be described in detail with reference to the attached drawings.

Figure 1:
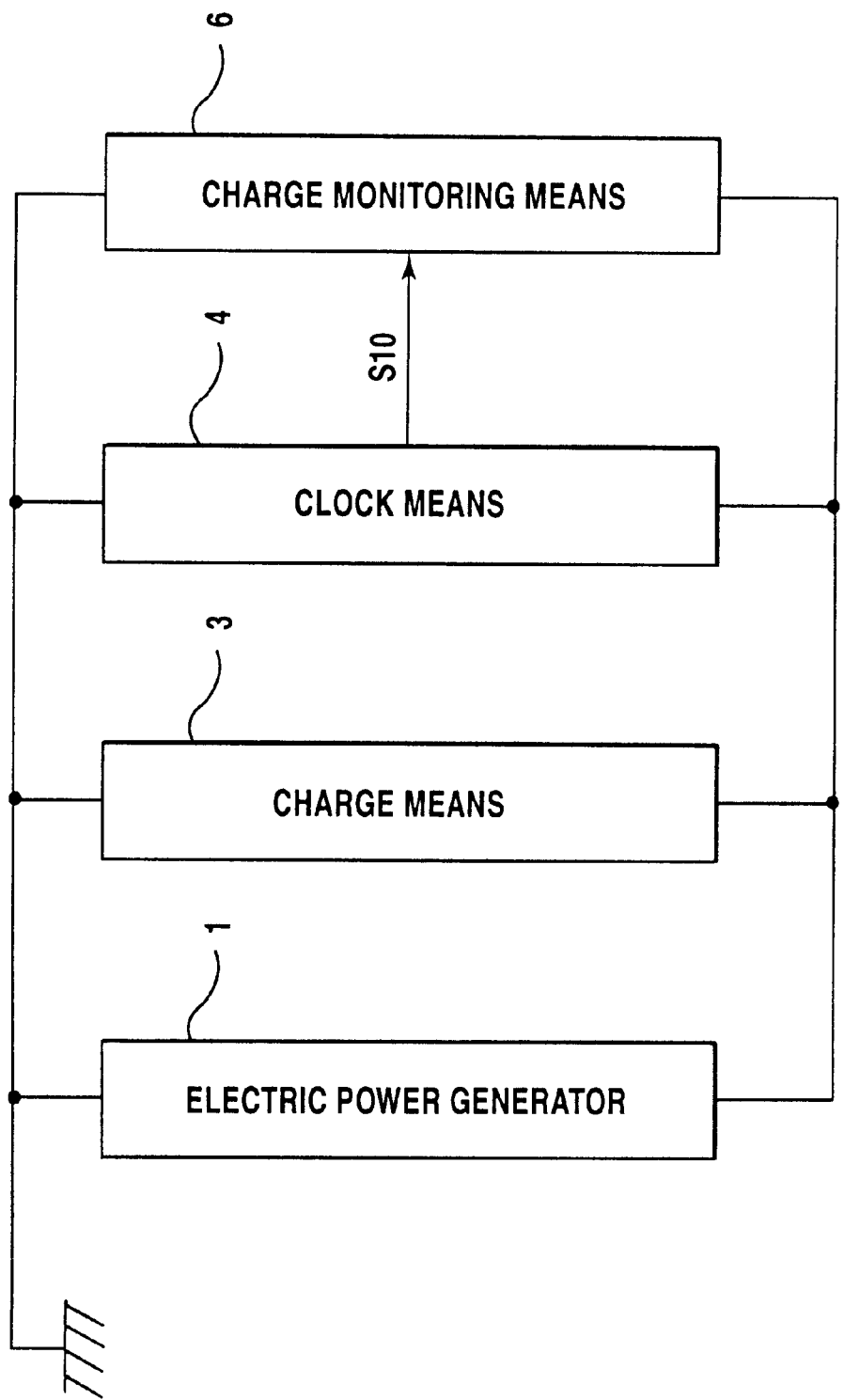
FIG. 1 is a block diagram showing an arrangement of an electronic watch provided with an electric power generator according to a general embodiment of the present invention.

FIG. 1 is a block diagram showing an arrangement of an electronic watch provided with an electric power generator according to a general embodiment of the present invention.

The electronic watch comprises, as shown in FIG. 1, an electric power generator 1 which generates power by external energy, charge means 3 for charging the power generated by the electric power generator 1, clock means 4 and charge monitoring means 6. A common connecting line disposed at the upper side in FIG. 1 is grounded and another common connecting line disposed at the lower side in FIG. 1 has a negative voltage.

Used as the electric power generator 1 are a solar cell, a thermopower generation unit for generating power by the difference of temperature between ambient temperature and physical temperature, or a mechanical power generation device for generating power by mechanical oscillation.

Used as the charge means 3 are a capacitor having large capacity such as an electric double layer capacitor, or a rechargeable secondary cell, for example, a lithium cell such as a titanium•lithium ion secondary cell.

Although the clock means 4 is a clock device for executing time display operation in a digital display mode or an analog display mode by hands owing to power generated by the electric power generator 1 or power stored in the charge means 3, it generates a count pulse S10 for counting the amount of power of the charge means 3. The count pulse S10 is a pulse capable of discriminating different polarities, etc., during charging of the charge means 3 while electric power generator 1 generates power and during discharging of the charge means 3.

The charge monitoring means 6 counts the amount of stored power of the charge means 3 in response to the count pulse S10 and displays the counted amount of power. The amount of stored power can be counted by incrementing or counting up the count pulse during charging, or by decrementing or counting down the count pulse during discharging in a condition where the counted pulse is discriminated. The display of the amount of counted power can be always performed by a digital display unit or an analog display unit.

Accordingly, the amount of stored power of the charge means can be exactly monitored.

Concrete embodiments of the electronic watch provided with an electric power generator of the present invention will be next described. First of all, a first embodiment will be described with reference to FIG. 2 to FIG. 8.

Figure 2:
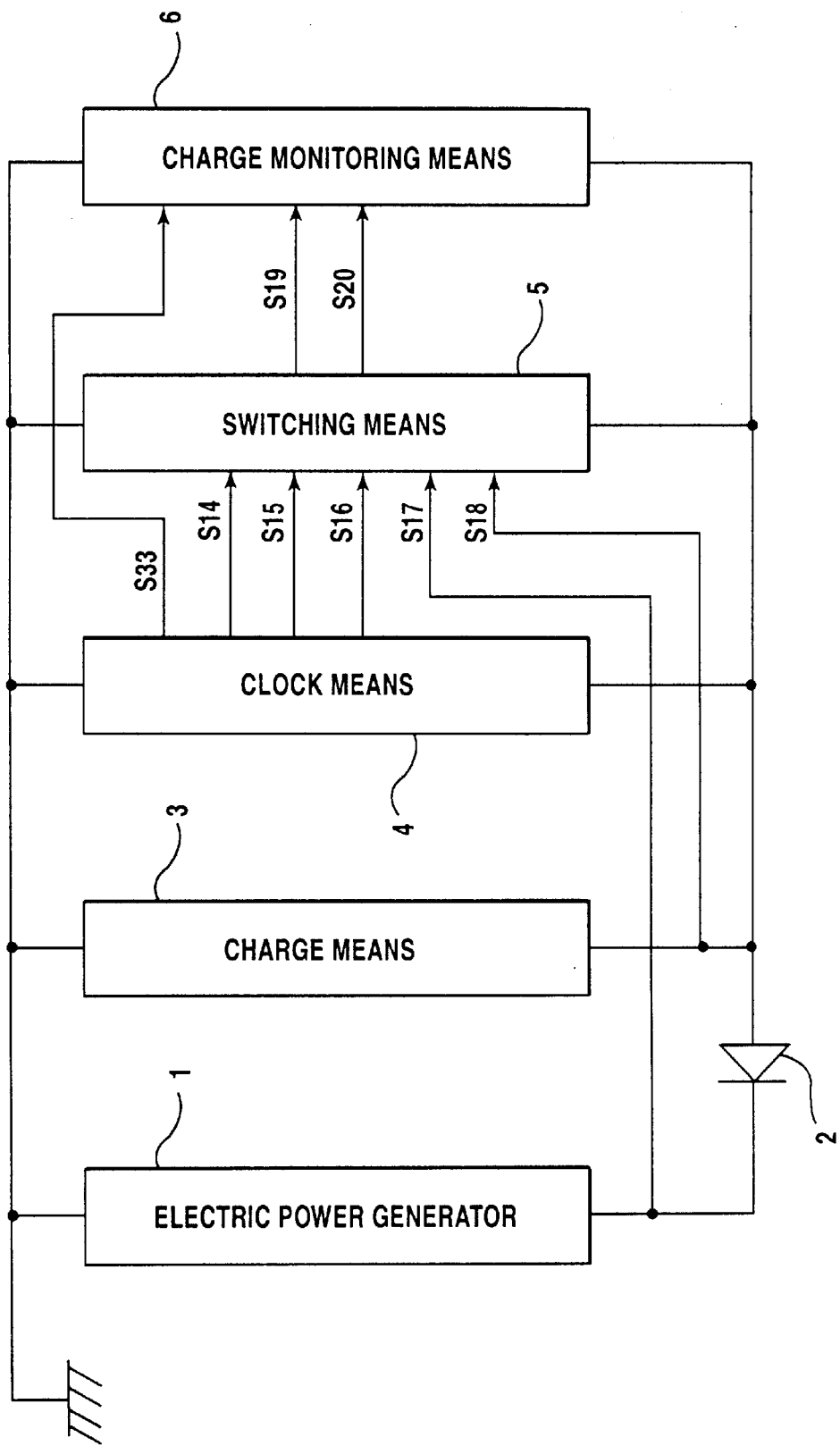
FIG. 2 is a block diagram showing an arrangement of an electronic watch provided with an electric power generator according to a first embodiment of the present invention.

FIG. 2 is a block diagram showing an arrangement of an electronic watch according to the first embodiment, and components which correspond to those in FIG. 1 are denoted by the same reference numerals.

The electronic watch comprises, like the general embodiment shown in FIG. 1, the electric power generator 1 which generates electric energy from external energy for driving the electronic watch, the charge means 3 for charging the generated power, the clock means 4 and the charge monitoring means 6.

Further, according to the first embodiment, there are provided reverse current flow prevention means 2 between the electric power generator 1 and the charge means 3, and switching means 5 between the clock means 4 and the charge monitoring means 6.

The clock means 4 executes time display operation by power generated by the electric power generator 1 or by the power stored in the charge means 3, and it produces a first count pulse S14 for counting the amount of power generated by the electric power generator 1, a second count pulse S15 for counting the amount of power consumed by the charge means 3, a display pulse S33 for use in displaying the amount of stored power of the charge means 3, and a switching signal pulse S16 for switching between the first count pulse S14 and the second count pulse S15.

The switching means 5 receives the first count pulse S14, the second count pulse S15, and the switching signal pulse S16 from the clock means 4, a power generating voltage S17 from the electric power generator 1, and a charging voltage S18 from the charge means 3, respectively, and outputs a count pulse S19 for selecting either the first count pulse S14 or the second count pulse S15 and a control signal S20 for controlling count-up/down operation.

The charge monitoring means 6 counts the amount of stored power of the charge means 3 in response to the count pulse S19 selected by the switching means 5 and the control signal S20, and displays the amount of stored power in response to the counted value and the display pulse S33.

These means are arranged in the manner that the ground side of the charge means 3, the clock means 4, the switching means 5 and the charge monitoring means 6 are respectively connected to the ground side of the electric power generator 1, while the charge means 3, the clock means 4, the switching means a and the charge monitoring means 6 at the side where power is supplied are connected to an output side of the electric power generator 1 through the reverse current prevention means 2.

The electric power generator 1 may be any suitable means if it converts external energy into electric energy. For example, thermopower generation means for generating electric energy in accordance with the principle of the Seebeck effect is one such means, and this case uses a module formed by combining many paired thermoelectric elements composed of a p-semiconductor material and an n-semiconductor material which are serially connected to each other.

The thermopower generation means generates power by the effect of a temperature difference. It has a hot pole at one end and a cold pole at the other end. When this thermopower generation means is used in a wrist watch, it is disposed in such a manner that the back side contacting the skin of the user of the wrist watch forms a hot pole, and the front side contacting the ambient atmosphere forms the cold pole.

As means for converting external energy into electric energy, it is needless to say that a common solar cell or a mechanical electric power generator for generating power by the motion of rotating weights in accordance with the motion of the user's arm can be used in addition to the thermopower generation means.

The reverse current prevention means 2 prevents the current from reversely flowing from the charge means 3 to the electric power generator 1 and it comprises a semiconductor element such as a diode.

The charge means 3 is a rechargeable secondary cell and employs a lithium secondary cell, e.g. a titanium lithium ion secondary cell.

Figure 3:
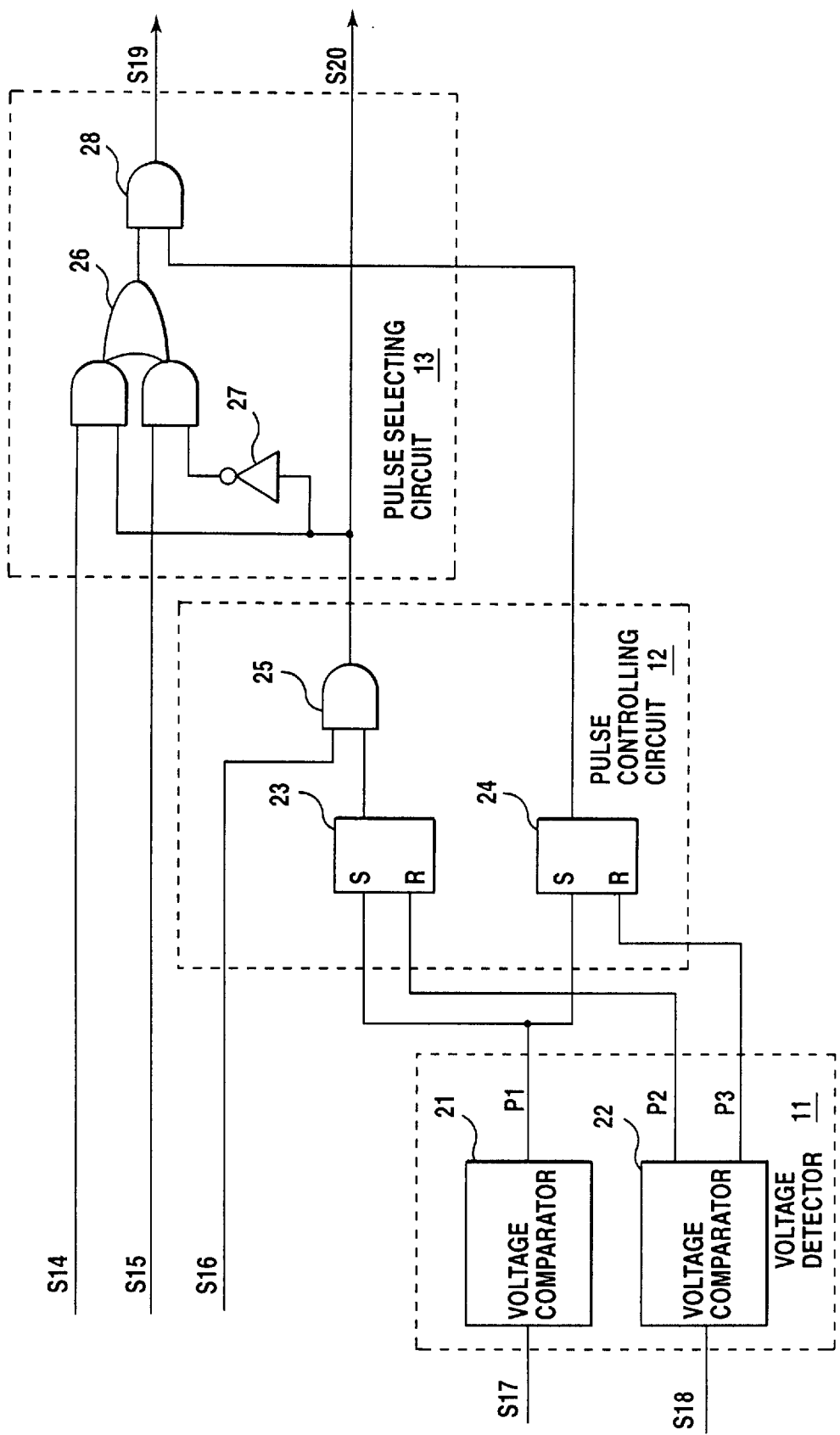
FIG. 3 is a circuit diagram showing a concrete arrangement of switching means in the first embodiment.

The switching means 5 comprises, as shown in FIG. 3, a voltage detector 11, a pulse controlling circuit 12 and a pulse selecting circuit 13.

The voltage detector 11 comprises voltage comparators 21 and 22 for generating pulses when each input voltage exceeds a predetermined voltage value. The voltage comparator 21 receives the power generating voltage S17 of the electric power generator 1 and outputs a pulse P1 when the absolute value thereof exceeds a set value. The voltage comparator 22 receives the charging voltage S18 of the charge means 3 and outputs a first pulse P2 when the absolute value thereof exceeds a first set value, and a second pulse P3 when the absolute value thereof exceeds a second set value.

The pulse controlling circuit 12 comprises a pair of set•reset flip-flops (hereinafter referred to as SR-FFs) 23 and 24 and a gate circuit 25.

The pulse P1 outputted from the voltage comparator 21 is inputted to set input terminals S of the SR-FFs 23 and 24, the first pulse P2 outputted from the voltage comparator 22 is inputted to a reset input terminal R of the SR-FF 23, and the second pulse P3 outputted from the voltage comparator 22 is inputted to a reset input terminal R of the SR-FF 24. The output of the SR-FF 23 is inputted to a second input terminal of the gate circuit (AND circuit) 25 and the switching signal pulse S16 from the clock means 4 is inputted to a first input terminal of the gate circuit 25.

The pulse selecting circuit 13 comprises an AND/OR selection gate circuit 26, an inverter 27 and a gate circuit (AND circuit) 28. The first count pulse S14 from the clock means 4 is inputted to a first input terminal of the AND/OR selection gate circuit 26 and the second count pulse S15 is inputted to a second input terminal thereof. The output of the gate circuit 25 of the pulse controlling circuit 12 is inputted to a first control terminal of the AND/OR selection gate circuit 26 and the output of the gate circuit 25 is also inputted to a second control terminal thereof via the inverter 27.

The output of the AND/OR selection gate circuit 26 is inputted to a first input terminal of the gate circuit 28 and the output of the SR-FF 24 of the pulse controlling circuit 12 is inputted to a second input terminal thereof. The output of the gate circuit 28 is the selected count pulse S19, which is inputted to the charge monitoring means 6 together with the control signal S20 which is the output of the gate circuit 25 of the pulse controlling circuit 12.

Figure 4:
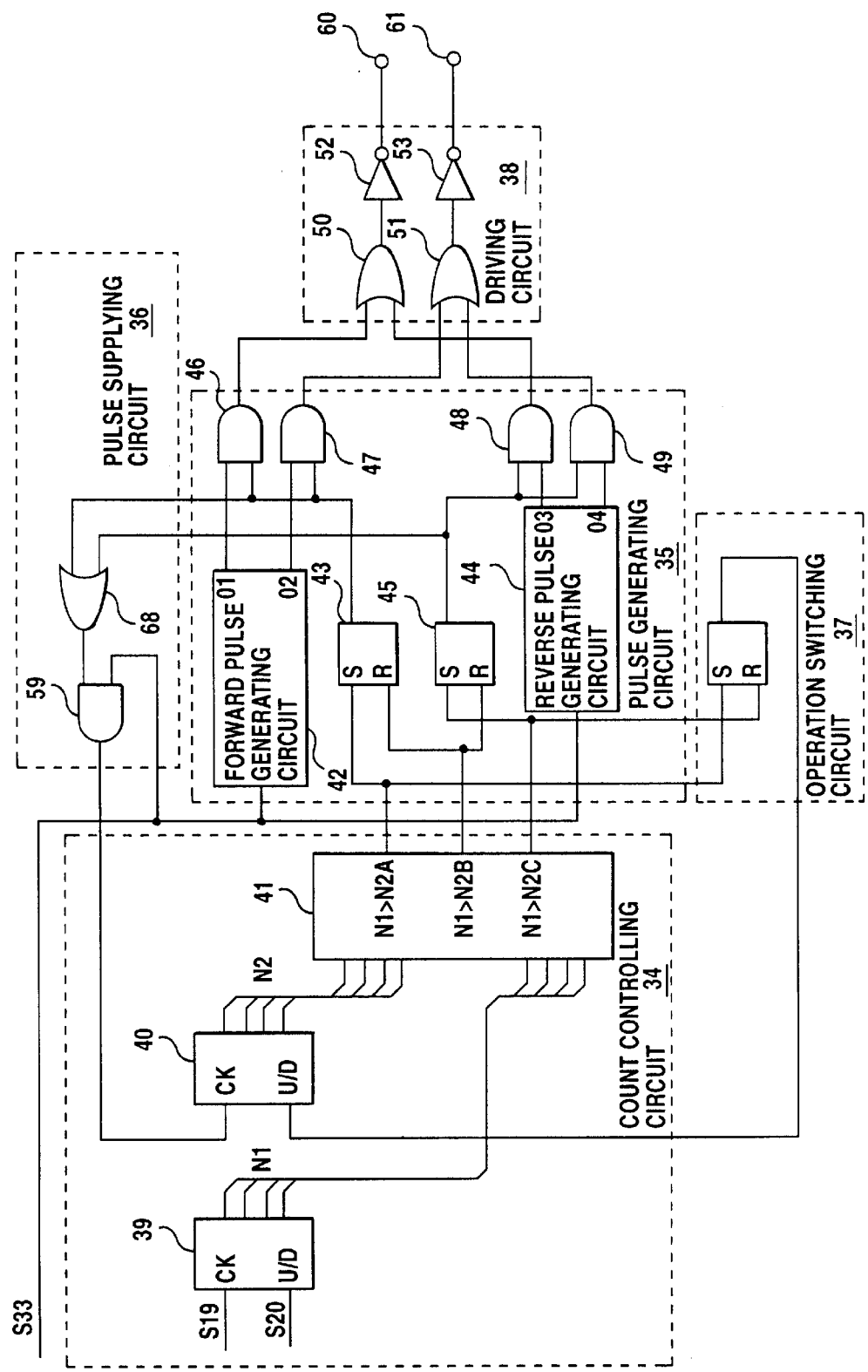
FIG. 4 is a circuit diagram showing an arrangement of charge monitoring means in the first embodiment.
Figure 5:
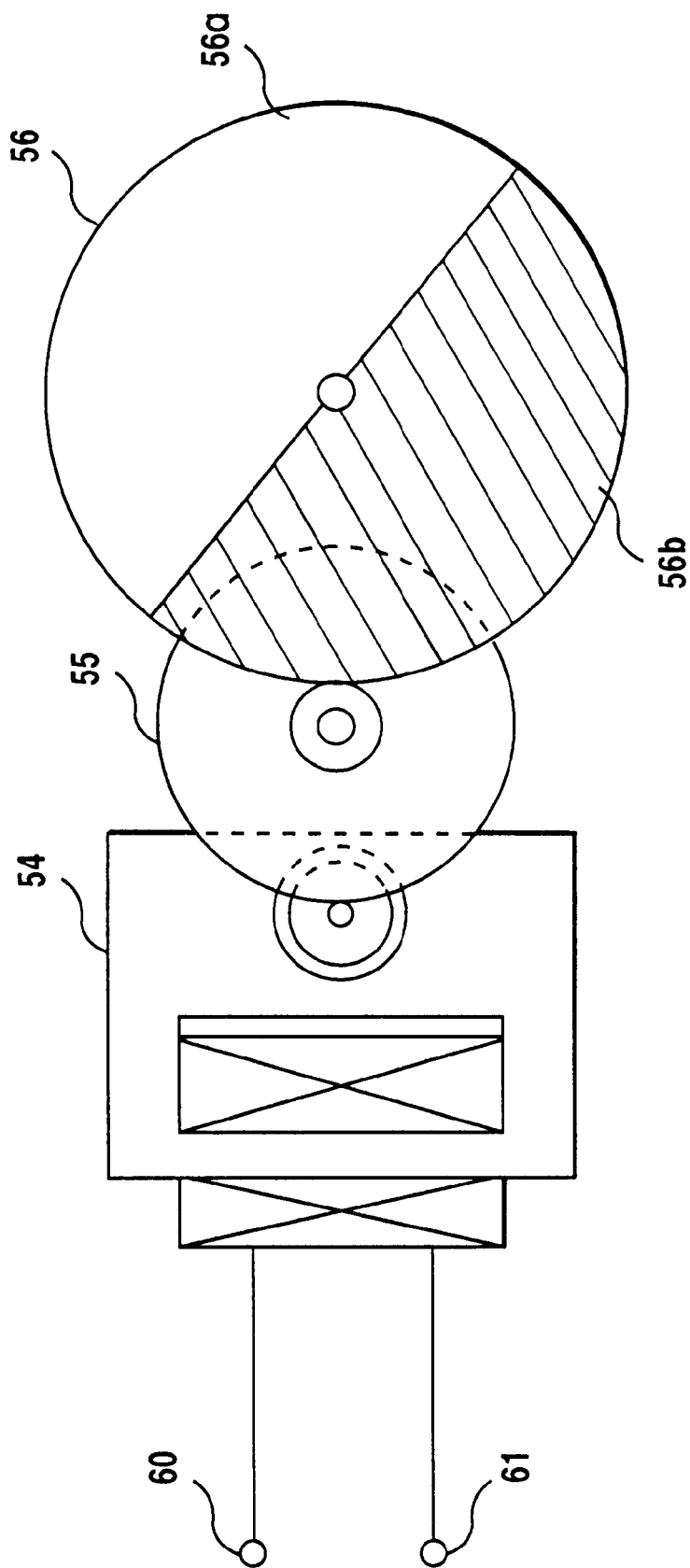
FIG. 5 is a view showing a concrete example of a display mechanism in the charge monitoring means in the first embodiment.

The charge monitoring means 6 comprises a display control circuit composed of a count controlling circuit 34, a pulse generating circuit 35, a pulse supplying circuit 36, an operation switching circuit 37 and a driving circuit 38 as shown in FIG. 4, and a display mechanism composed of a pulse motor 54, a transmission gear 55 and a display plate 56 as shown in FIG. 5.

In FIG. 4, the count controlling circuit 34 comprises a first counting circuit 39, a second counting circuit 40 and a magnitude comparator 41. suppose that counted values of the first counting circuit 39 are N1 and that the counted values of the second counting circuit 40 are N2.

The selected count pulse S19 which is outputted from the pulse selecting circuit 13 of the switching means 5 is inputted to a clock input terminal CK of the first counting circuit 39 and the control signal S20 outputted from the pulse controlling circuit 12 of the switching means 5 is inputted to a control terminal U/D thereof for switching the count-up operation or count-down operation of the first counting circuit 39.

The counted value N1 outputted from the first counting circuit 39 and the counted value N2 outputted from the second counting circuit 40 are respectively inputted to the magnitude comparator 41 as comparison inputs. The magnitude comparator 41 includes a first output terminal A, a second output terminal B and a third output terminal C.

An output of the magnitude comparator 41 is produced at the first output terminal A when the inputted counted value N1 is greater than the counted value N2(N1>N2), an output of the same is produced at the second output terminal B when the inputted counted value N1 is equal to the counted value N2(N1<N2), and an output of the same is produced at the third output terminal C when the inputted counted value N1 is less than the counted value N2(N1<N2).

Although the first counting circuit 39 and the second counting circuit 40 are respectively shown as hexadecimal counters having four outputs for facilitating the explanation in FIG. 4, they are not limited to such counters but may be a counter capable of counting many numbers. Further, since the magnitude comparator 41 is a general circuit composed of a combination of comparators formed of a NOR gate or a NAND gate, explanation of the circuit arrangement inside thereof is omitted.

The output of the first output terminal A of the magnitude comparator 41 of the count controlling circuit 34 is inputted to a set input terminal S of an SR-FF 43 of the pulse generating circuit 35 and a set input terminal S of an SR-FF serving as the operation switching circuit 37. An output of the second output terminal B is inputted to a reset input terminal R of the SR-FF 43 and a reset input terminal R of an SR-FF 45. Further, an output of the third output terminal C is inputted to a set input terminal S of the SR-FF 45 and a reset input terminal R of the SR-FF serving as the operation switching circuit 37.

The output of the SR-FF 43 is inputted to a second input terminal of a gate circuit (AND circuit) 46, a second input terminal of a gate circuit (AND circuit) 47 and a first input terminal of a gate circuit (OR circuit) 68 of the pulse supplying circuit 36. The output of the SR-FF 45 is inputted to a first input terminal of a gate circuit 48, a first input terminal of a gate circuit 49 and a second input terminal of the gate circuit 68 of the pulse supplying circuit 36.

The output of the gate circuit 68 of the pulse supplying circuit 36 is inputted to a first input terminal of a gate circuit (AND circuit) 59. Further, the output of the gate circuit 59 is inputted to a clock input terminal CK of the second counting circuit 40 of the count controlling circuit 34.

The output of the SR-FF serving as the operation switching circuit 37 is inputted to the control terminal U/D of the second counting circuit 40 of the count controlling circuit 34 for switching the count-up operation or count-down operation of the second counting circuit 40.

The display pulse S33 from the clock means 4 is inputted to a second input terminal of the gate circuit 59 of the pulse supplying circuit 36, the input terminal of a forward pulse generating circuit 42 of the pulse generating circuit 35 and the input terminal of a reverse pulse generating circuit 44.

The output of a first output terminal O1 of the forward pulse generating circuit 42 is inputted to a first input terminal of the gate circuit 46, and the output of a second output terminal O2 thereof is inputted to a first input terminal of the gate circuit 47.

Further, the output of a first output terminal O3 of the reverse pulse generating circuit 44 is inputted to a second input terminal of the gate circuit (AND circuit) 48 and the output of a second output terminal O4 thereof is inputted to a second input terminal of the gate circuit (AND circuit) 49.

Since the forward pulse generating circuit 42 and the reverse pulse generating circuit 44 are respectively formed of a waveform generating circuit which is generally employed by a pulse motor driving circuit of a watch, explanation of the internal circuit arrangements thereof are omitted.

The output of the gate circuit 46 of the pulse generating circuit 35 is inputted to a first input terminal of a gate circuit (OR circuit) 50 of the driving circuit 38 and the output of the gate circuit 47 is inputted to a first input terminal of a gate circuit (OR circuit) 51. Further, the output of the gate circuit 48 is inputted to a second input terminal of the gate circuit 50 and the output of the gate circuit 49 is inputted to a second input terminal of the gate circuit 51.

The output of the gate circuit 50 of the driving circuit 38 is inputted to the input terminal of a driving inverter 52 and the output of the gate circuit 51 thereof is inputted to the input terminal of a driving inverter 53.

Accordingly, the output of the driving inverter 52 of the driving circuit 38 and the output of the driving inverter 53 of the same driving circuit 38 are inputted to input terminals 60, 61 of the pulse motor 54 constituting the display mechanism as shown in FIG. 5.

In FIG. 5, the rotary output of the pulse motor 54 is transmitted to the transmission gear 55 through its pinion, and the rotation of the transmission gear 55 is transmitted to the discoid display plate 56 which is colored with two different colors at a semicircular one-half and another half thereof, for example, which is colored separately at a white portion 56a and a red portion (denoted by hatched lines) 56b.

Figure 6:
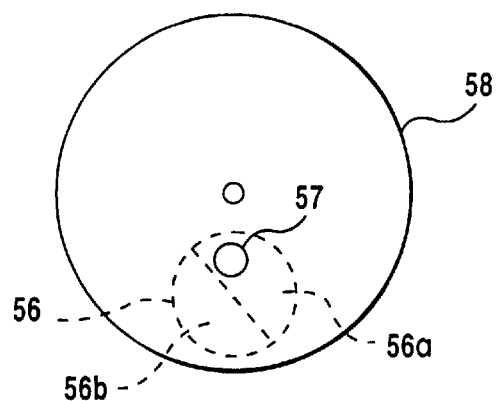
FIG. 6, FIG. 7 and FIG. 8 are views each showing concrete examples of displaying the amount of stored electric charge in the charge means by the display mechanism shown in FIG. 5.
Figure 7:
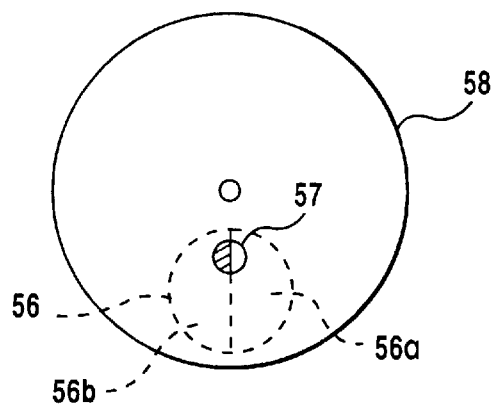
Figure 8:
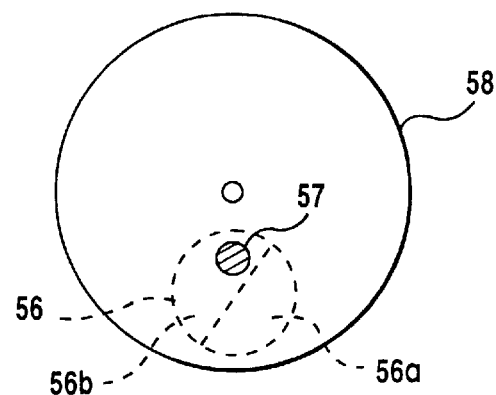

A part of the display plate 56 can be seen from the outside through a display window 57 defined in a dial 58 of a watch as shown in FIGS. 6 to 8.

FIG. 6 shows a state where only the white portion 56a of the display plate 56 is displayed in the display window 57 and represents that the amount of stored power of the charge means 3 is low.

FIG. 7 shows a state where the white portion 56a and the red portion 56b of the display plate 56 are displayed half each and represents that the stored power of the charge means 3 is half of the amount of power when it is fully charged.

FIG. 8 shows a state where only the red portion 56b of the display plate 56 is displayed and represents that the amount of stored power of the charge means 3 is equal to that when it is fully charged.

The operation of the first embodiment having the arrangement as set forth above will now be described.

Figure 15:
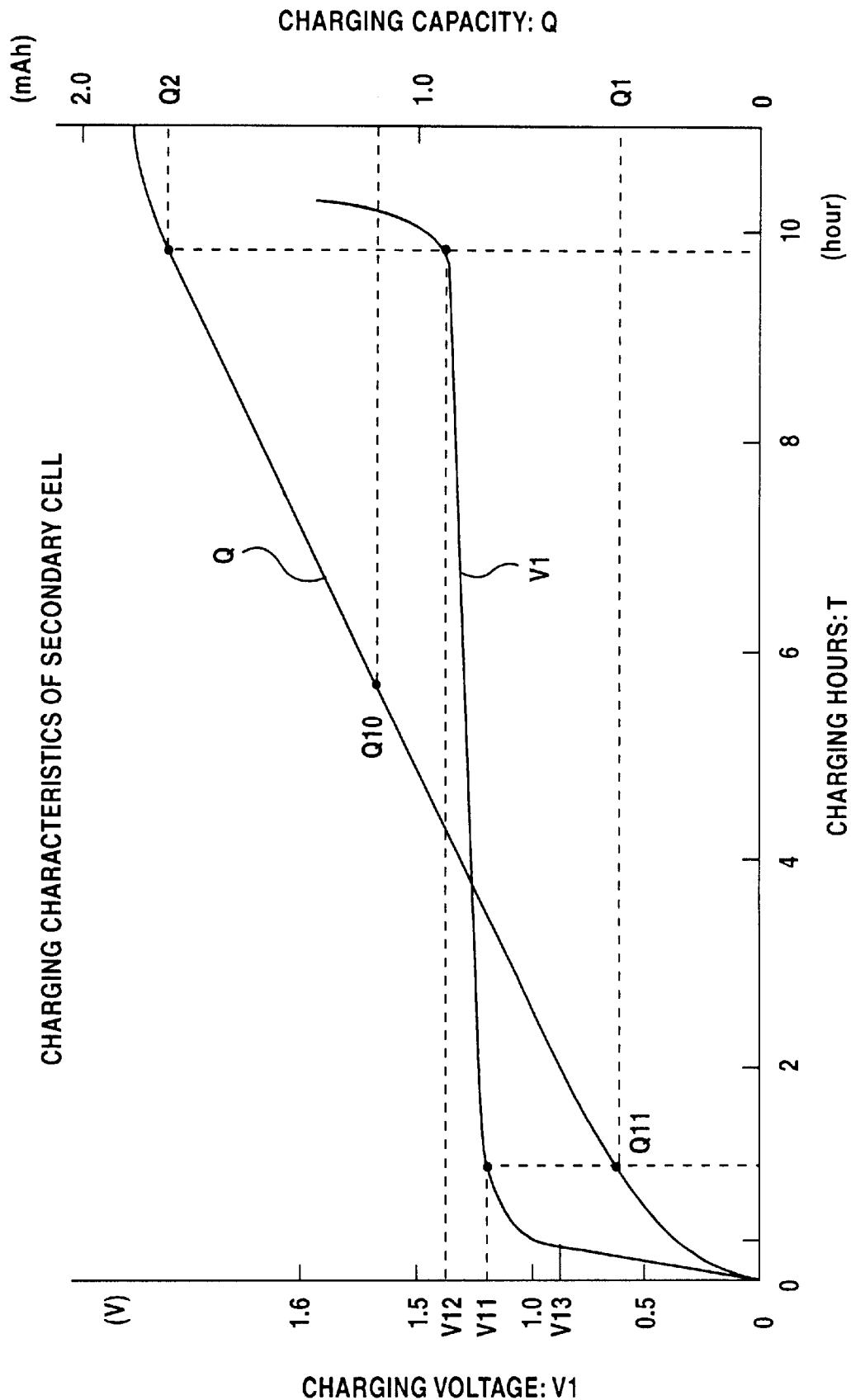
FIG. 15 is a diagram showing charging characteristics of a secondary cell.

First, when there is no amount of stored power in the charge means 3 in FIG. 2, the charging voltage V1 of charging characteristics of the secondary cell in FIG. 15 is 0 volt, and hence the clock means 4 does not operate.

Suppose that external energy is converted into power by the electric power generator 1 and power is stored in the charge means 3. If the charging voltage of the charge means 3 increases to about 0.9 V which is the minimum operating voltage V13 of the clock means 4, namely, V13=0.9 volts, the clock means 4 starts its operation.

The clock means 4 comprises, like an ordinary watch although not shown, an oscillation circuit, a divider circuit, a pulse generating circuit, a driving circuit, a pulse motor, a train of gears, hands, etc., to provide a time display function. The clock means 4 further produces the first count pulse S14, the second count pulse S15, the switching signal pulse S16 and the display pulse S33.

At this time, the counted value N1 of the first counting circuit 39 of the charge monitoring means 6 and the counted value N2 of the second counting circuit 40 are reset to "0", and the display window 57 of the dial 58 of the display mechanism displays white alone which represents that there is no stored power.

In the switching means 5 shown in FIG. 3, although the internal circuits of the voltage comparators 21 and 22 of the voltage detector 11 are not illustrated in detail, they are the same as those of a general voltage detector, and hence, when a detection voltage value is set, for example, by dividing resistance, if an input voltage is equal to a set voltage value or is greater than or approximately equal to the set voltage value, the voltage comparators 21 and 22 produce output pulses.

The voltage comparator 21 produces the output pulse P1 when the power generating voltage S17 of the electric power generator 1 becomes higher than a voltage value which is obtained by subtracting a dropped voltage Vd in the reverse current prevention means 2 from the charging voltage V11 shown in FIG. 15. The voltage comparator 22 produces the first output pulse P2 when the charging voltage S18 of the charge means 3 becomes higher than the charging voltage V11 as shown in FIG. 15 and also produces the second output pulse P3 when it is substantially equal to V13 which is the minimum operating voltage.

Accordingly, the output pulse P1 of the voltage comparator 21 and the first output pulse P2 of the voltage comparator 22 are produced substantially at the same time when the charge means 3 is charged by power of the electric power generator 1, while the output pulse P1 of the voltage comparator 21 is produced immediately after the first output pulse P2 of the voltage comparator 22 is produced owing to the dropped voltage Vd of the reverse current prevention means (diode).

The SR-FFs 23 and 24 of the pulse controlling circuit 12 are set, although not shown, to "LOW" at their outputs at their initialization state.

Accordingly, the charging voltage S18 of the charge means 3 is not less than the minimum operating voltage V13, the voltage comparator 22 produces the second output pulse P3, and the output of the SR-FF 24 is reset and the output thereof remains "LOW". As a result, the gate circuit 28 of the pulse selecting circuit 13 remains inhibited, and the output of the pulse selecting circuit 13 remains "LOW".

Since the count pulse S19 is not outputted from the pulse selecting circuit 13, nothing is inputted to the clock input terminal of the first counting circuit 39 of the count controlling circuit 34 of the charge monitoring means 6 as shown in FIG. 4 so that the first counting circuit 39 does not start counting. Accordingly, since the display control circuit connected to the count controlling circuit 34 does not operate, the display mechanism is not changed, and the display of the dial 58 keeps the state shown in FIG. 6.

Meanwhile, when power is stored in the charge means 3 by power generated by the electric power generator 1 and the charging voltage S18 reaches the charging voltage V11 shown in FIG. 15 as the stored power increases, the voltage comparator 22 produces the first output pulse P2 and the output of the SR-FF 23 is reset, and it is set again by the output pulse P1 which is produced at the output terminal of the voltage comparator 21 immediately after the reset of the SR-FF 23, and hence the output of the SR-FF 23 becomes "HIGH". Further, the SR-FF 24 is also set so that the output thereof becomes "HIGH". The charging capacity Q at this time becomes Q11 shown in FIG. 15.

As a result, the gate circuit 25 of the pulse controlling circuit 12 and the gate circuit 28 of the pulse selecting circuit 13 shown in FIG. 3 are released from inhibition, so that the switching signal pulse S16 is outputted as the control signal S20 which is an output of the pulse controlling circuit 12 through the gate circuit 25.

In the first embodiment, the frequency of the switching signal pulse S16, i.e., the control signal S20 (hereinafter referred to as F3) is less than 1 Hz, for example, a 0.1 Hz signal pulse having 10 second cycles, which outputs "LOW" for five seconds after "HIGH" is outputted for five seconds, is employed.

While the control signal S20 is "HIGH", the first count pulse S14 passes through the AND/OR selection gate circuit 26 of the pulse selecting circuit 13 and is outputted through the gate circuit 28 so that the pulse selecting circuit 13 outputs the first count pulse S14 as the count pulse S19.

While the control signal S20 is "LOW", the second count pulse S15 passes through the AND/OR selection gate circuit 26 of the pulse selecting circuit 13 and is outputted through the gate circuit 28, so that the pulse selecting circuit 13 outputs the second count pulse S15 as the count pulse S19.

When the frequency F3 of the switching signal pulse S16, i.e., the control signal S20 is 0.1 Hz, the first count pulse S14 becomes the pulse having a frequency which is proportional to the amount of power of the charge means 3 in which the power generated by the electric power generator 1 is charged for ten seconds (this frequency is hereinafter referred to as F1), while the second count pulse S15 becomes a pulse having a frequency which is proportional to the discharge power involved in the amount of power consumed in the electric watch, namely, consumed by the clock means 4, etc., for 10 seconds (this frequency is hereinafter referred to as F2). Both frequencies F1 and F2 are set to frequencies which are higher than the frequency F3 so that at least one clock pulse can be counted in a half cycle of the frequency F3.

The control signal S20 from the switching means 5 is inputted to the control terminal U/D of the first counting circuit 39 of the count controlling circuit 34 of the charge monitoring means 6 as shown in FIG. 4, and the first counting circuit 39 operates as an up counter while the control signal S20 (i.e. switching signal pulse S16) is "HIGH" and operates as a down counter while the control signal S20 is "LOW".

Suppose that F1 is, e.g., 0.1 Hz, then the first counting circuit 39 operates as the up counter for 5 seconds during which the switching signal pulse S16 is "HIGH", so that the first count pulse S14, which is selected as the count pulse S19 and has the frequency F1 proportional to the power to be charged in the charge means 3, is inputted to the clock input terminal of the first counting circuit 39, and the counted value N1 of the first counting circuit 39 increases from the initial value 0 proportional to the power to be charged. At this time, the power to be charged for 10 seconds is counted up for 5 seconds during which the first counting circuit 39 operates as the up counter upon the setting of frequency F1.

The first counting circuit 39 operates as the down counter for 5 seconds during which the switching signal pulse S16 is "LOW" so that the second counting pulse S15 of the frequency F2 is inputted to the clock input terminal thereof as the selected count pulse proportional to the amount of discharging power involved in the consumption of power in the electronic watch, and the counted value N1 of the first counting circuit 39 decreases in accordance with the discharging power. The amount of power to be consumed for 10 seconds is counted down for 5 seconds during which the first counting circuit 39 operates as the down counter upon the setting of F2. Accordingly, the first counting circuit 39 will have counted the charging amount and discharging amount six times 1 minute after the initiation of counting.

If the charging amount is greater than the discharging amount, the counted value N1 of the first counting circuit 39 is greater than the initialization value 0 of the counted value N2 of the second counting circuit 40, namely, N1>N2 is established, and the output of the first output terminal A of the magnitude comparator 41 is brought to "HIGH".

As a result, the output of the SR-FF 43 of the pulse generating circuit 35 is brought to "HIGH" so that the gate circuits 46 and 47 are released from inhibition. Further, the gate circuit 59 is also released from inhibition through gate circuit 68 of the pulse supplying circuit 36.

Thereafter at the interval of one minute, a forward driving pulse is produced at the output terminals O1 and O2 of the forward pulse generating circuit 42 by the display pulse S33. Further, since the output of the SR-FF of the operation switching circuit 37 is brought to "HIGH" and the control terminal of the second counting circuit 40 is brought to "HIGH", the second counting circuit 40 starts operation as the up counter.

Although the display pulse S33 is designed to correspond to intervals of one minute, if it is designed to correspond to longer intervals of time, the consumption power of the display mechanism can be reduced.

The display pulse S33 passes through the gate circuit 59 of the pulse supplying circuit 36 and is inputted to the clock input terminal CK of the second counting circuit 40, then the second counting circuit 40 continues to count up until the counted value N2 is equal to the counted value N1 of the first counting circuit 39 (N2=N1). Since the gate circuits 46 and 47 are released from inhibition, the forward driving pulses are supplied to the driving inverters 52 and 53 through the gate circuits 50 and 51 of the driving circuit, and they are inverted and supplied to the pulse motor 54 of the display mechanism as shown in FIG. 5. As a result, the pulse motor 54 rotates clockwise and rotates the display plate 56 clockwise via the transmission gear 55.

If N1=N2 is established, the output of the second output terminal B of the magnitude comparator 41 shown in FIG. 4 is brought to "HIGH" and hence the SR-FF 43 is reset and its output is brought to "LOW" so that the output of the SR-FF 45 is not changed while remaining at the initially set value 0, and the gate circuits 46, 47 inhibit the output from passing therethrough to stop the supply of the forward driving pulse to the driving circuit 38. Accordingly, the pulse motor 54 shown in FIG. 5 stops its rotation so that the display plate 56 keeps rotating slightly clockwise and stops.

Since the output of the SR-FF 43 and that of the SR-FF 45 shown in FIG. 4 are respectively "LOW", the output of the gate circuit 68 of the pulse supplying circuit 36 is brought to "LOW" so that the gate circuit 59 inhibits the output from passing therethrough. Accordingly, the display pulse S33 is inhibited to pass through the gate circuit 59, and the second counting circuit 40 stops counting.

With the repetition of the aforementioned operations, the amount of power to be charged in the charge means 3 is continuously counted as the counted value N1 of the first counting circuit 39 of the count controlling circuit 34 and the amount of stored power corresponding thereto is displayed by the rotating position of the display plate 56.

As an example of the display plate 56, for example, in the case of a secondary cell having full charging capacity of, e.g., a little less than 2 mAh (charging capacity value Q1 in FIG. 15), when the secondary cell of the charge means 3 has Q10 which is slightly greater than a half of the full charging capacity, the display by the display plate 56 of the charge monitoring means 6 shown in FIG. 5 is in a state where the white portion 56a and the red portion 56b are respectively displayed by halves on the display window 57 as shown in FIG. 7. Further, when the secondary cell of the charge means 3 reaches the full charging capacity of about 2 mAh, the display by the display plate 56 is in a state where only the red portion 56b is displayed on the display window 57 as shown in FIG. 8.

Next, a state where the electric power generator 1 cannot generate power will be described.

The power is not generated when the electronic watch is taken off from the user's arm in the case of the electric power generator 1 using a generator utilizing thermopower or inertial force, and when the electric watch is put into a desk, etc., cutting off light, in the case of the electric power generator 1 using a solar cell.

In these cases, the power generating voltage S17 of the electric power generator 1 is almost 0 volts, and hence the output pulse P1 of the voltage comparator 21 of the voltage detector 11 of the switching means 5 as shown in FIG. 3 is not produced so that the set input terminals of the SR-FFs 23 and 24 are brought to "LOW". Suppose that the charge means 3 has sufficient stored power and the charging voltage S18 shows the voltage to be not less than the charging voltage V11 in FIG. 15.

In this case, the voltage comparator 22 that received the charging voltage S18 of the charge means 3 outputs the first output pulse P2 to reset the SR-FF 23 and hence the output of the SR-FF 23 is brought to "LOW" and the gate circuit 25 inhibits the switching signal pulse S16 to pass therethrough. Accordingly, the output of the gate circuit 25 is brought to "LOW" and the control signal S20 which is the output of the pulse controlling circuit 12 remains "LOW". Further, a second count pulse corresponding to the power consumed in the electronic watch is selected as the count pulse S19 which serves as the output of the pulse selecting circuit 13.

When the control signal S20 is brought to "LOW" output alone, the first counting circuit 39 of the count controlling circuit 34 of the charge monitoring means 6 shown in FIG. 4 operates as the down counter alone.

Accordingly, the counted value N1 of the first counting circuit 39 decreases gradually while the power consumption of the electronic watch increases. Since the counted value N2 of the second counting circuit 40 holds its previous values, the counted value N1 is less than the counted value N2, namely, N1<N2 is established.

Accordingly, the output is produced at the third output terminal C of the magnitude comparator 41 of the count controlling circuit 34, and hence the SR-FF 45 of the pulse generating circuit 35 is set and its output is brought to "HIGH", and the SR-FF of the operation switching circuit 37 is reset and its output is brought to "LOW".

As a result, the second counting circuit 40 operates as the down counter so that the gate circuits 48 and 49 are released from inhibition. Further, the output of the gate circuit 68 of the pulse supplying circuit 36 is brought to "HIGH" and the gate circuit 59 is released from inhibition. Accordingly, the second counting circuit 40 counts down in response to the display pulse S33 and a reverse driving pulse is produced at the output terminals O3 and O4 of the reverse pulse generating circuit 44.

The reverse driving pulse is inputted to the driving circuit 38 through the gate circuits 48 and 49. The reverse driving pulse is further inverted by the driving inverters 52 and 53 through the gate circuits 50 and 51, and it is inputted to the input terminals 60 and 61 of the pulse motor 54 of the display mechanism as shown in FIG. 5, so that the pulse motor 54 drives the output shaft counterclockwise and rotates the display plate 56 counterclockwise via transmission gear 55.

When the counted value N2 of the second counting circuit 40 is equal to the counted value N1 of the first counting circuit 39 (N2=N1), the second output terminal B of the magnitude comparator 41 is brought to "HIGH" to reset the SR-FF 43 and SR-FF 45 so that the respective outputs thereof are brought to "LOW" and the gate circuits 48 and 49 inhibit the respective outputs from passing therethrough, and hence the supply of the reverse driving pulse to the driving circuit 38 is stopped. As a result, the pulse motor 54 stops its rotation and the display plate 56 stops while it slightly rotates counterclockwise.

Since the outputs of the SR-FF 43 and SR-FF 4a are respectively "LOW", the output of the gate circuit 68 of the pulse supplying circuit 36 is brought to "LOW" so that the gate circuit 59 inhibits the output from passing therethrough. Accordingly, since the display pulse S33 is inhibited to pass through the gate circuit 59, the second counting circuit 40 stops counting.

With the repetition of the aforementioned operations, the stored power of the charge means 3 is continuously counted as the counted value N1 of the first counting circuit 39 of the count controlling circuit 34, and it is, corresponding thereto, displayed by the ratio of the red portion of the display plate 56 which appears in the display window 57 shown in FIG. 7, etc.

If the power is not generated in the electric power generator 1 during this period, the stored power of the charge means 3 decreases as the electronic watch consumes the power, so that the charging capacity becomes a charging capacity Q10 as shown in FIG. 15. The display by the display mechanism of the charge monitoring means 6 at this time becomes red and white by halves as shown in FIG. 7. Further, when the stored power decreases, the charging voltage reaches the charging voltage V11 as shown in FIG. 15, and charging capacity becomes Q11 so that the display by the display mechanism of the charge monitoring means 6 is white alone as shown in FIG. 6.

Figure 16:
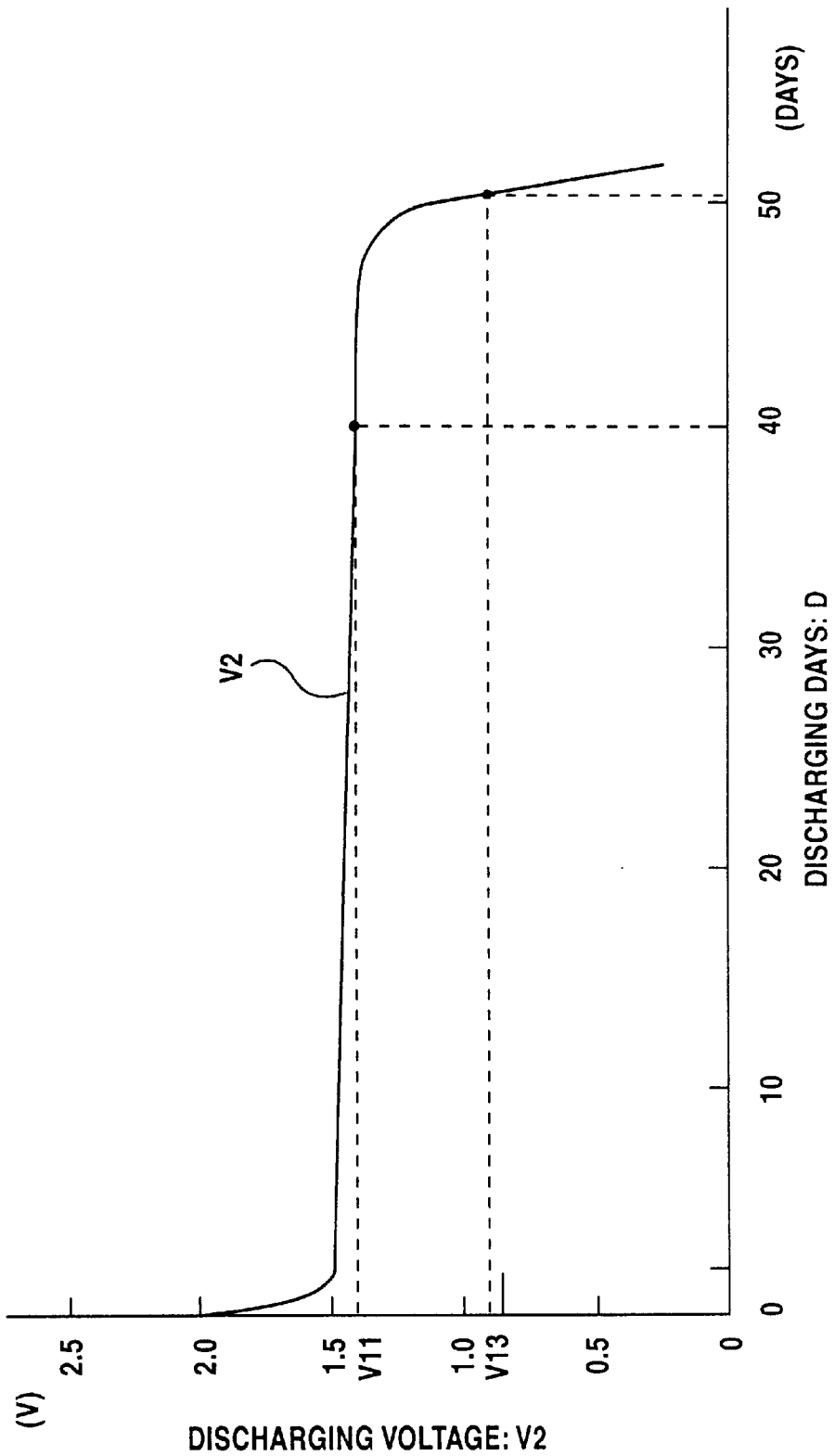
FIG. 16 is a diagram showing discharging characteristics of a secondary cell.

Viewing the discharging characteristics of the secondary cell shown in FIG. 16 of the charging voltage V11 in FIG. 15, it is understood that the electronic watch is operable for more than 10 days while it has the charging capacity Q11 if the charging voltage V2 is voltage V11. The operable time can be set to an arbitrary period by regulating the frequency F2 of the second count pulse corresponding to the consumption power of the electronic watch.

As mentioned above, according to the first embodiment, the stored power of the charge means 3 can always be displayed visually so that the amount of stored power can be exactly known.

Accordingly, even if the amount of stored power is half of the amount of full charged power, the charge monitoring means 6 displays red and white by halves as illustrated in FIG. 7, and it can be verified that the operating time of the electronic watch is sufficient. For example, when a cell having two year's life as a power supply source is used, it is possible to verify that the electronic watch is operable for another one year.

Further, even if the charge monitoring means 6 displays all white when the amount of stored charged power further decreases shown in FIG. 6, the electronic watch can be operated for more than 10 days, thereby unnecessitating the quick charging or replacement with another cell in haste.

In this case, if users somewhat increase times to wear the electronic watch on their arms or time to expose the electronic watch to light so as to somewhat increase the power generated by the electric power generator 1 to charge the charge means 3, the electronic watch can continue its stable operation.

An electronic watch provided with an electric power generator according to a second embodiment of the invention will be described next.

Figure 9:
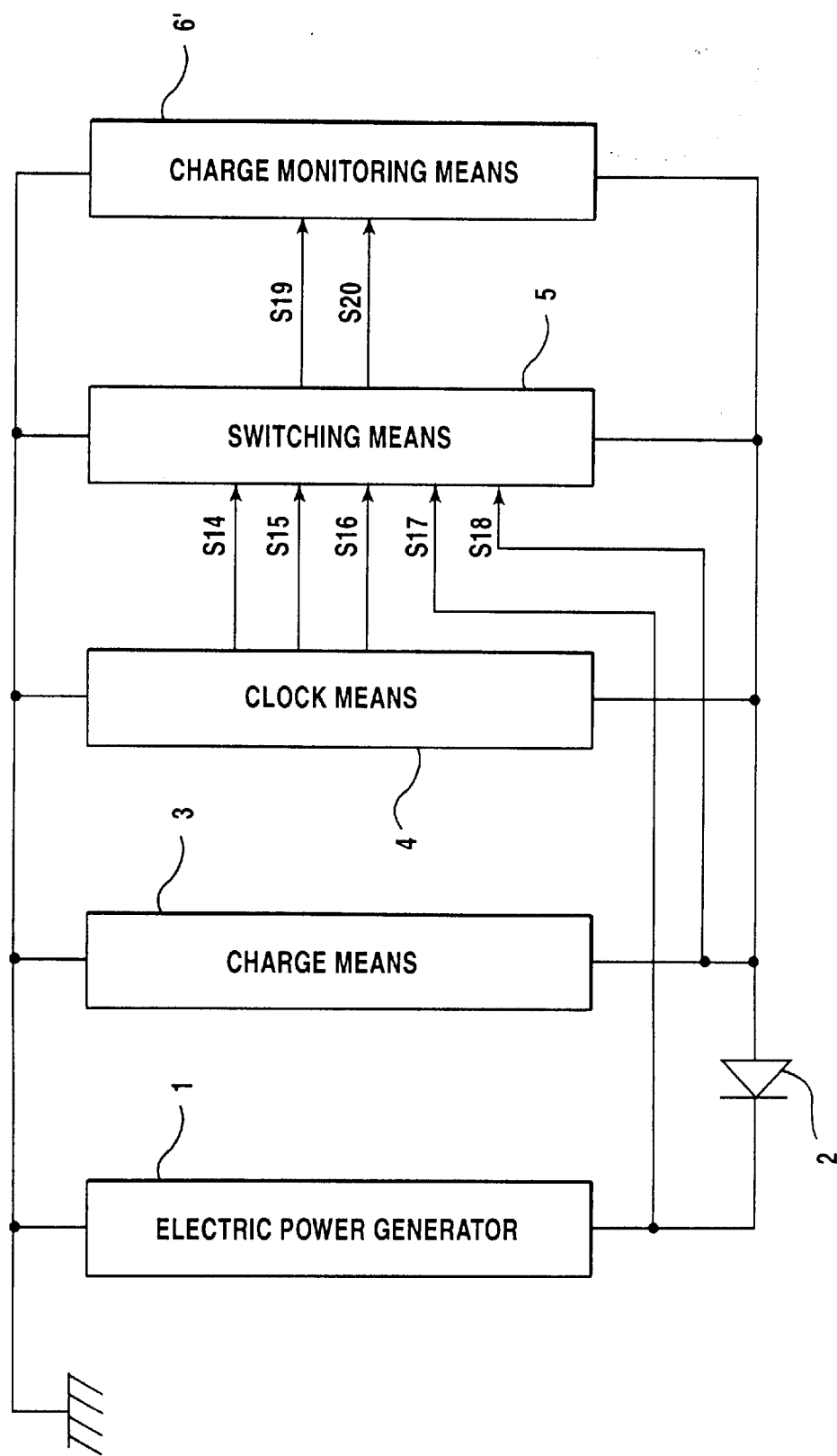
FIG. 9 is a block diagram showing an arrangement of an electronic watch provided with an electric power generator according to a second embodiment of the present invention.

FIG. 9 is a block diagram showing an arrangement of the electronic watch of the second embodiment, and components which correspond to those in FIG. 2 are denoted by the same reference numerals.

Figure 10:
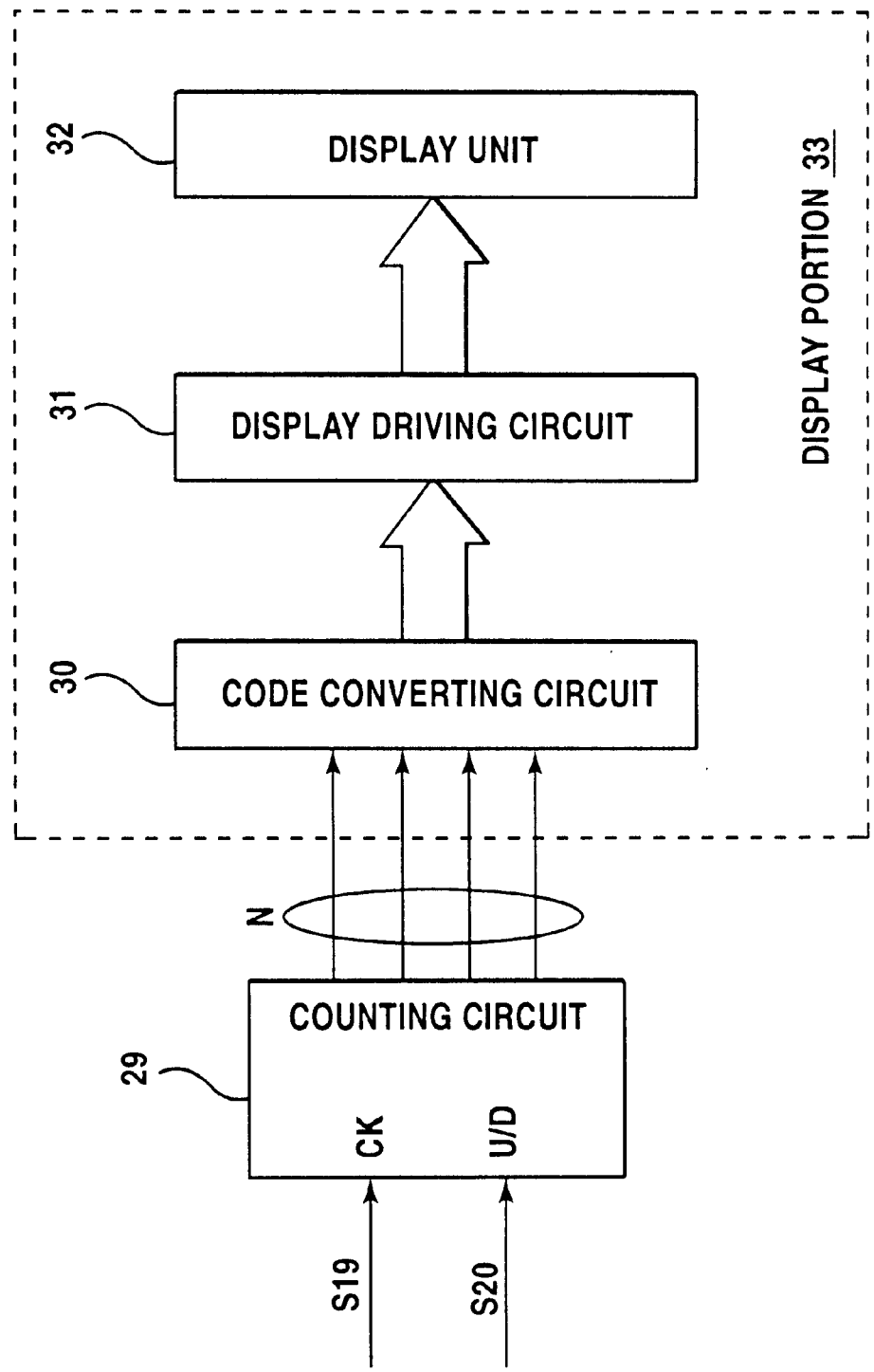
FIG. 10 is a block diagram showing an arrangement of charge monitoring means in the second embodiment.

FIG. 10 is a block diagram showing an internal arrangement of a charge monitoring means 6' in FIG. 9.

The electronic watch of the second embodiment has substantially the same arrangement as that of the first embodiment shown in FIG. 2 except the charge monitoring means 6'. That is, the electric power generator 1, the reverse current prevention means 2, the charge means 3 and the switching means 5 are the same as those of the first embodiment as shown in FIG. 2, and the clock means 4 is the same as that of the first embodiment except that the former does not output the display pulse S33.

The charge monitoring means 6' includes a counting circuit 29 formed of an up/down counter like the first counting circuit 39 of the first embodiment, and a display portion 33 composed of a code converting circuit 30, a display driving circuit 31 and a display unit 32.

The count pulse S19 selected by the switching means 5 which is the same as that shown in FIG. 3 is inputted to the clock input terminal CK of the counting circuit 29, and the control signal S20 by the switching signal pulse S16 is inputted to the control terminal U/D of the counting circuit 29 as the up/down counter.

The counted value N of the counting circuit 29 is outputted in a binary code, and the output value thereof is inputted to the display portion 33, and it is converted into a code by the code converting circuit 30 of the display portion 33, which code can be digitally displayed by, for example, a seven segment display. The converted code is inputted to the display driving circuit 31, and the display driving circuit 31 drives the display unit 32 such as a liquid crystal display capable of executing digital display, etc., to display the amount of stored power of the charge means 3.

The display unit 32 is not limited to the display unit for displaying digitally by the seven segments but can employ various display units for displaying with rod-like stringed segments, for example.

The amount of stored power of the charge means 3 can be exactly shown in the second embodiment like the first embodiment.

Figure 11:
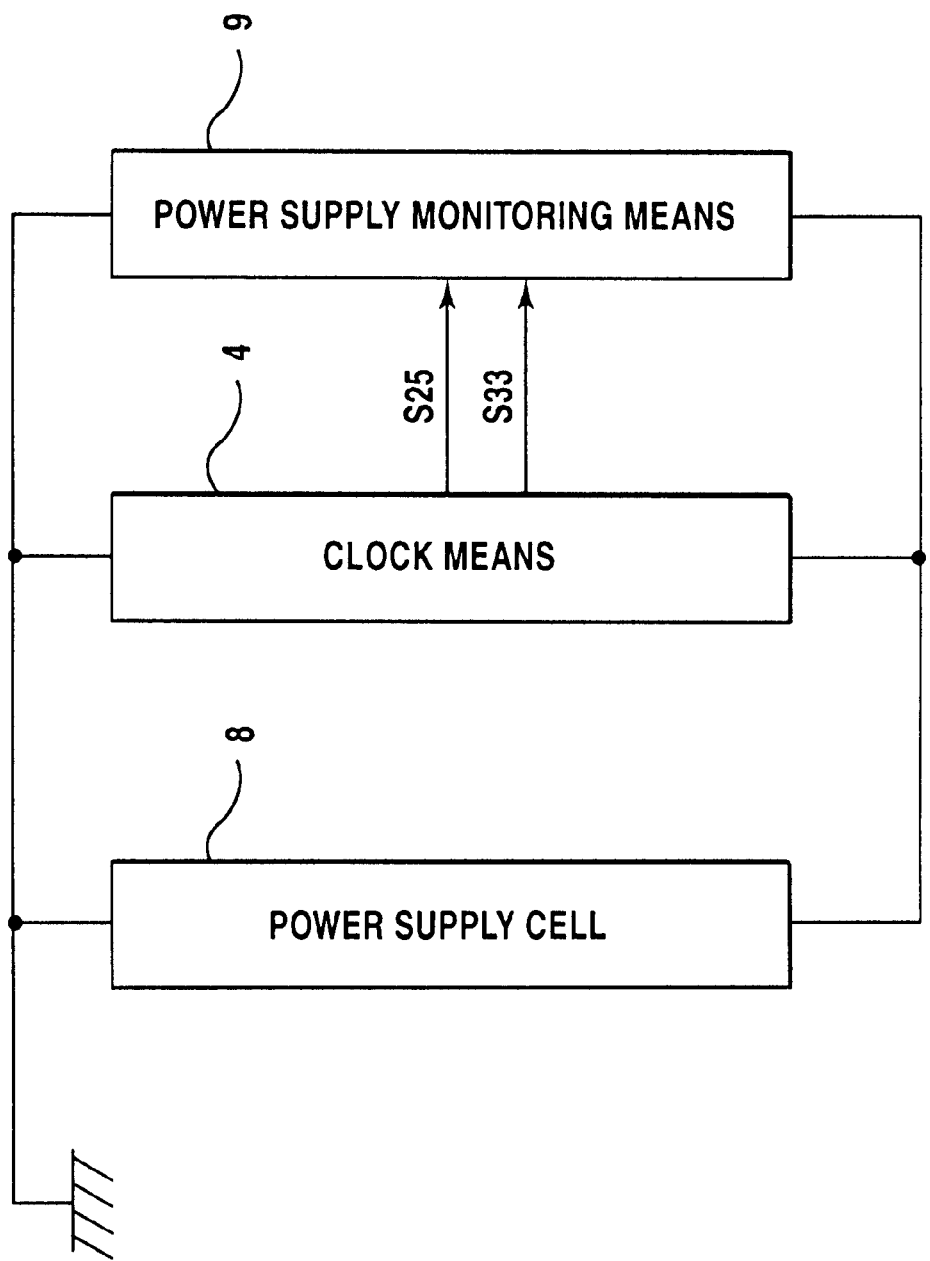
FIG. 11 is a block diagram showing an arrangement of an electronic watch provided with a power supply cell according to the first embodiment of the present invention.

An electronic watch using a power supply cell according to the first embodiment of the invention will now be described. FIG. 11 is a block diagram showing the arrangement of the electronic watch of the first embodiment.

The electronic watch comprises a power supply cell 8, a clock means 4 and a power supply monitoring means 9. That is, the electronic watch of the embodiment employs the power supply cell 8 which is a primary cell such as a common silver cell, and a lithium cell instead of the electric power generator 1 and the charge means 3 in the aforementioned respective embodiments, and the power supply monitoring means 9 instead of the charge monitoring means 6.

The clock means 4 executes time display operation by the power of the power supply cell 8 and produces a count pulse S25 for counting the amount of stored power of the power supply cell 8 and a display pulse S33 like that of the aforementioned embodiments.

The power supply monitoring means 9 includes display means for counting the amount of stored power of the power supply cell 8 in response to the count pulse S25 from the clock means 4 and displays the amount of stored power in response to the counted value and the display pulse S33.

Figure 12:
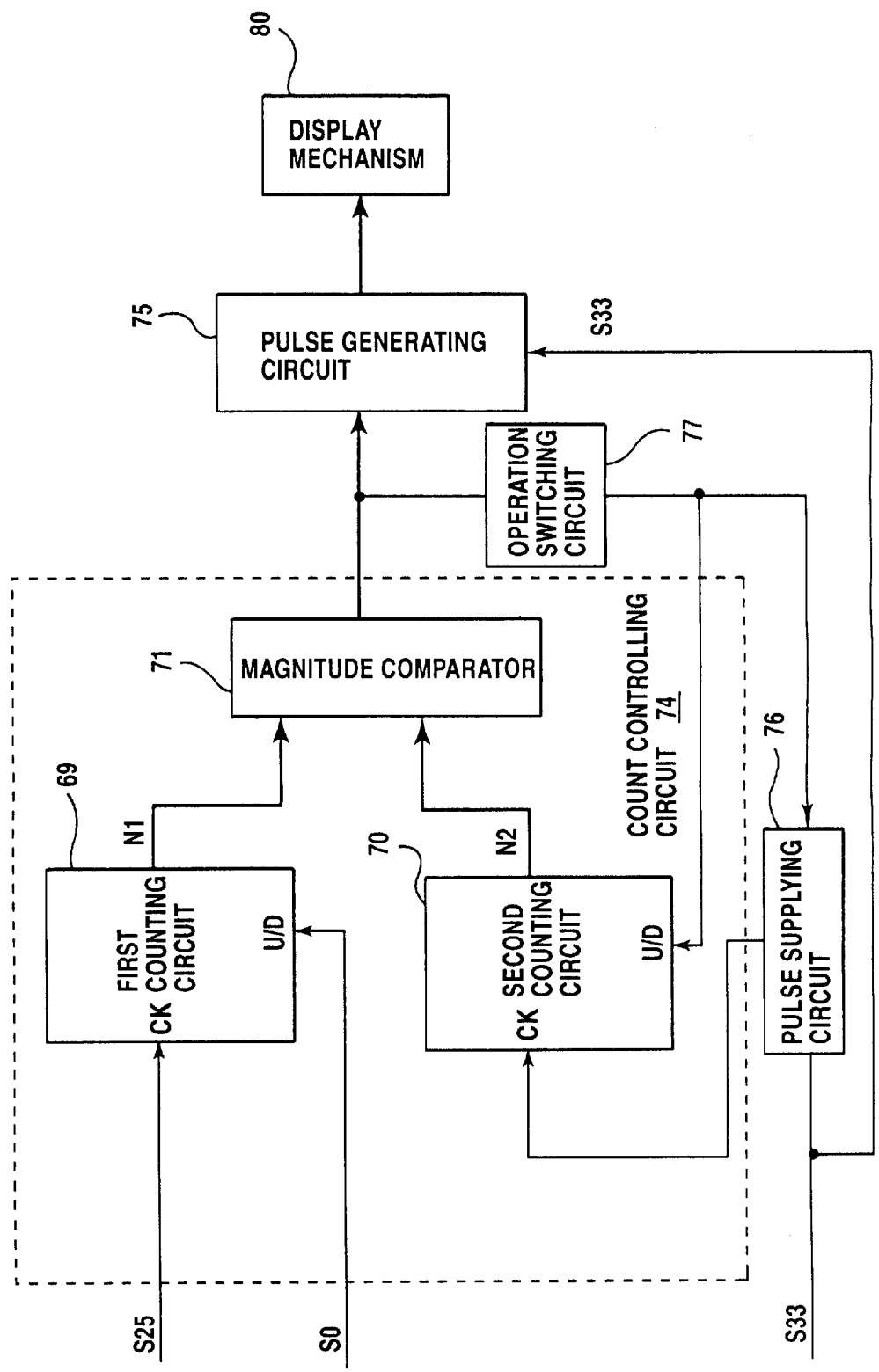
FIG. 12 is a block diagram showing an arrangement of the charge monitoring means in the first embodiment.

A more concrete arrangement of the power supply monitoring means 9 is illustrated in FIG. 12.

The power supply monitoring means 9 comprises a count controlling circuit 74, a pulse generating circuit 75, a pulse supplying circuit 76, an operation switching circuit 77 and a display mechanism 80.

The count controlling circuit 74 comprises a first counting circuit 69 for counting down upon receipt of the count pulse S25 from the clock means 4 as its clock input to be set to a given counting value upon receipt of a set signal S0, a second counting circuit 70 for counting up or down so as to obtain the same counted value as the counted value of the first counting circuit 69, and a magnitude comparator 71 for compaling the magnitude of a counted value N1 of the first counting circuit 69 and a counted value N2 of the second counting circuit 70 and for outputting the result of comparison.

The operation switching circuit 77 switches between the count-up operation and the count-down operation of the second counting circuit 70 in accordance with the result of comparison from the magnitude comparator 71. The pulse supplying circuit 76 supplies the display pulse S33 to a clock input terminal CK of the second counting circuit 70 in a case other than N2=N1, which is the result of comparison between the counted values N1 and N2.

The pulse generating circuit 75 produces a driving pulse in response to the result of comparison by the magnitude comparator 71 and the display pulse S33, and the display mechanism 80 is driven by the driving pulse to display the amount of stored power of the power supply cell 8.

As the display mechanism 80, it is possible to use a display mechanism formed of the pulse motor 54, the display plate 56 and the like as employed in the aforementioned embodiments shown in FIGS. 5 to 8.

The magnitude comparator 71 of the count controlling circuit 74, the pulse generating circuit 75 which operates in accordance with the result of comparison by the magnitude comparator 71, the pulse supplying circuit 76 and the operation switching circuit 77 are structured like the magnitude comparator 41, the pulse generating circuit 35, the pulse supplying circuit 36 and the operation switching circuit 37 in the aforementioned embodiment shown in FIG. 4. However, the pulse generating circuit 75 of this embodiment also includes the driving circuit 38 in FIG. 4.

The operation of this embodiment will now be described.

Figure 17:
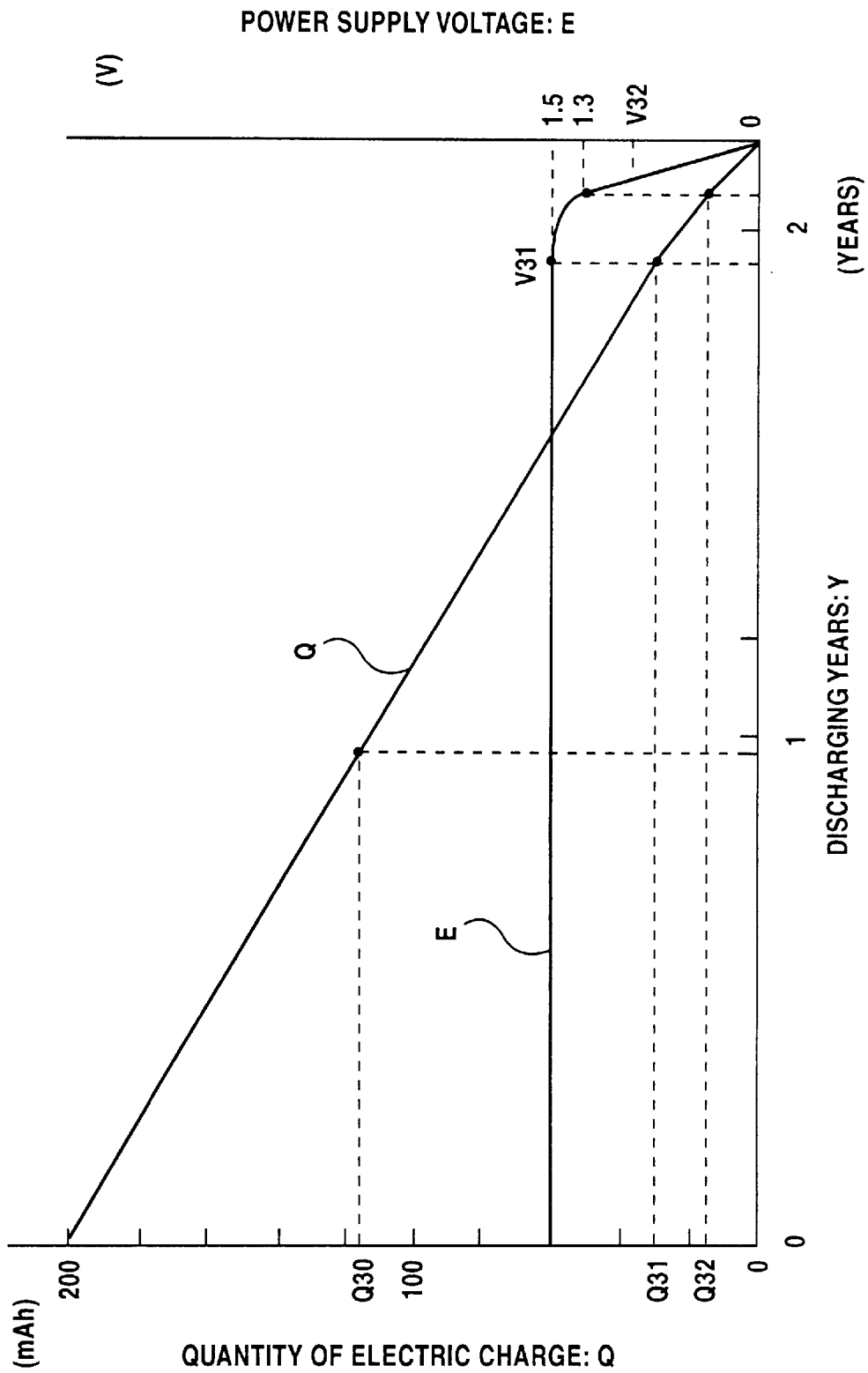
FIG. 17 is a diagram showing discharging characteristics of a silver cell.

When the power supply cell 8 shown in FIG. 11, although not shown in FIG. 12, is replaced with another or the back of the case of the electric watch is opened and closed, the set signal S0 is produced, and the first counting circuit 69 is set to a given value, e.g. corresponding to the maximum value of 200 mAh of the stored capacity of electric charge Q in the discharging characteristics of the silver cell shown in FIG. 17, namely, to the maximum value at which output bits are all brought to "HIGH".

As a result, when the stored capacity of electric charge Q shows the maximum value, the counted value N1 of the first counting circuit 69 becomes the maximum value and the expression N1>N2 is established between the counted values N1 and N2, so that the pulse generating circuit 75 produces a forward driving pulse by the display pulse S33, and the display mechanism 80 is driven by the driving pulse so that the display plate 56 is rotated clockwise by the pulse motor 54 shown in FIG. 5, and hence only the red portion 56b of the display plate 56 is displayed in the display window 57 of the dial 58 shown in FIG. 8, which represents that the amount of power stored in the power supply cell 8 is sufficient.

Thereafter, the operation is entirely the same as the first embodiment in a state where the electric power generator 1 does not generate power, and hence the detailed description is omitted. Since the first counting circuit 69 does not execute the switching between the count-up and count-down operations in response to the control signal, it executes only the down count of the count pulse S25 corresponding to the consumption power of the electronic watch.

While the amount of stored power of the power supply cell 8 decreases, the display plate 56 rotates little by little counterclockwise to represent the decrease of the stored power of the cell.

In the discharging characteristics of the silver cell shown in FIG. 17, the frequency of the count pulse S25 is set in the manner that when the stored capacity of electric charge Q of electric charge is Q30 which is slightly greater than the half thereof even if the cell voltage is a rated voltage, the display plate 56 is in a state where red and white are displayed by halves as shown in FIG. 7, while when the cell voltage is V31 and the stored capacity of electric charge Q is Q31, the display plate 56 is in a state where white alone is displayed as shown in FIG. 6.

Consequently, it is possible to operate the electronic watch for a long period of time of about one month until the cell voltage falls to the operation stop voltage of V32 even if the display is in the state shown in FIG. 6. The operable period can be arbitrarily set by adjusting the frequency of the count pulse S25.

Accordingly, according to this embodiment, the amount of stored power of the power supply cell 8 can always be exactly displayed, which can be verified.

Figure 13:
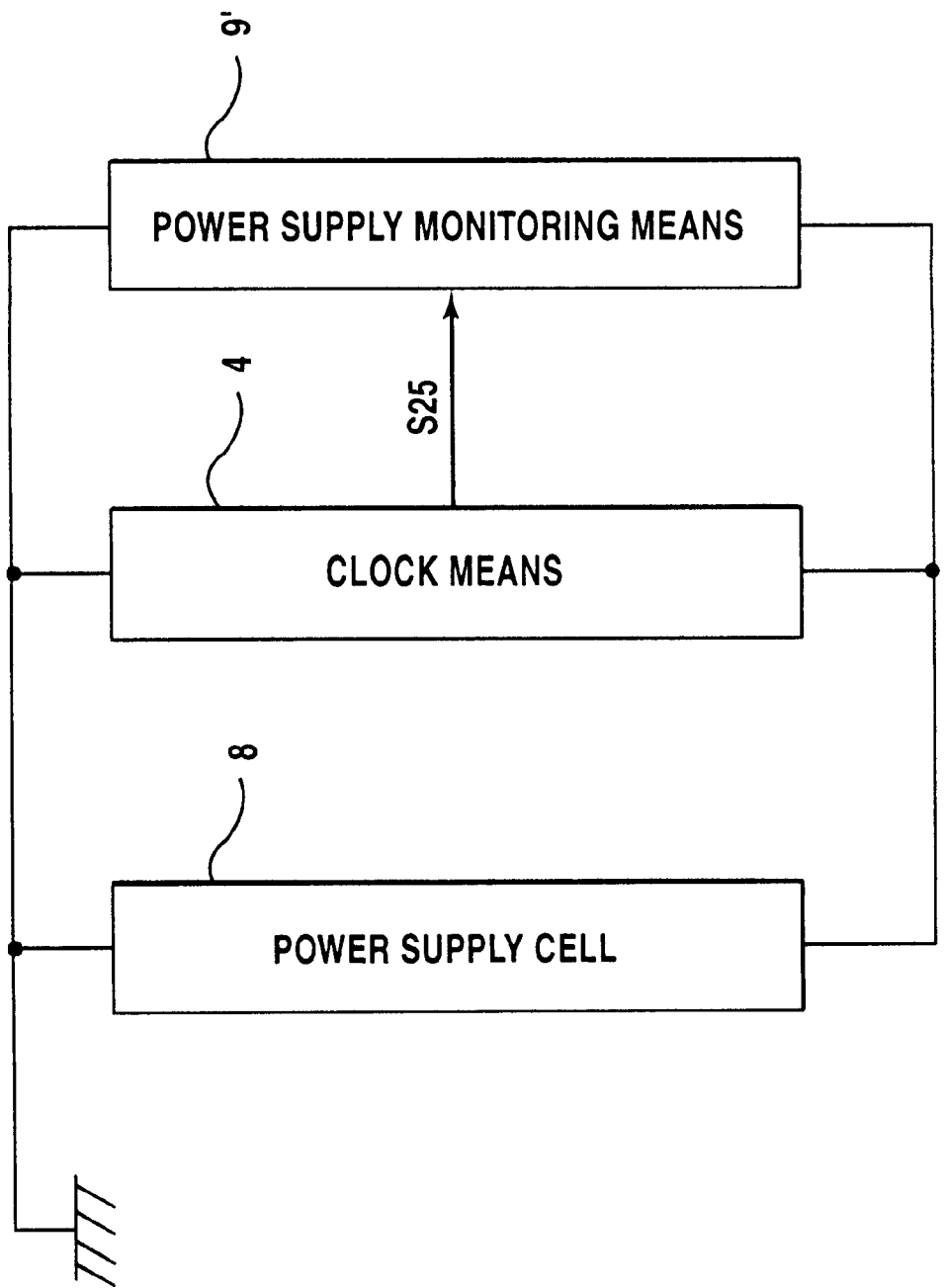
FIG. 13 is a block diagram showing an arrangement of an electronic watch provided with a power supply cell according to the second embodiment of the present invention.

Finally, an electronic watch using the power supply cell according to the second embodiment of the invention will be described. FIG. 13 is a block diagram showing an arrangement of the electronic watch of the second embodiment.

Figure 14:
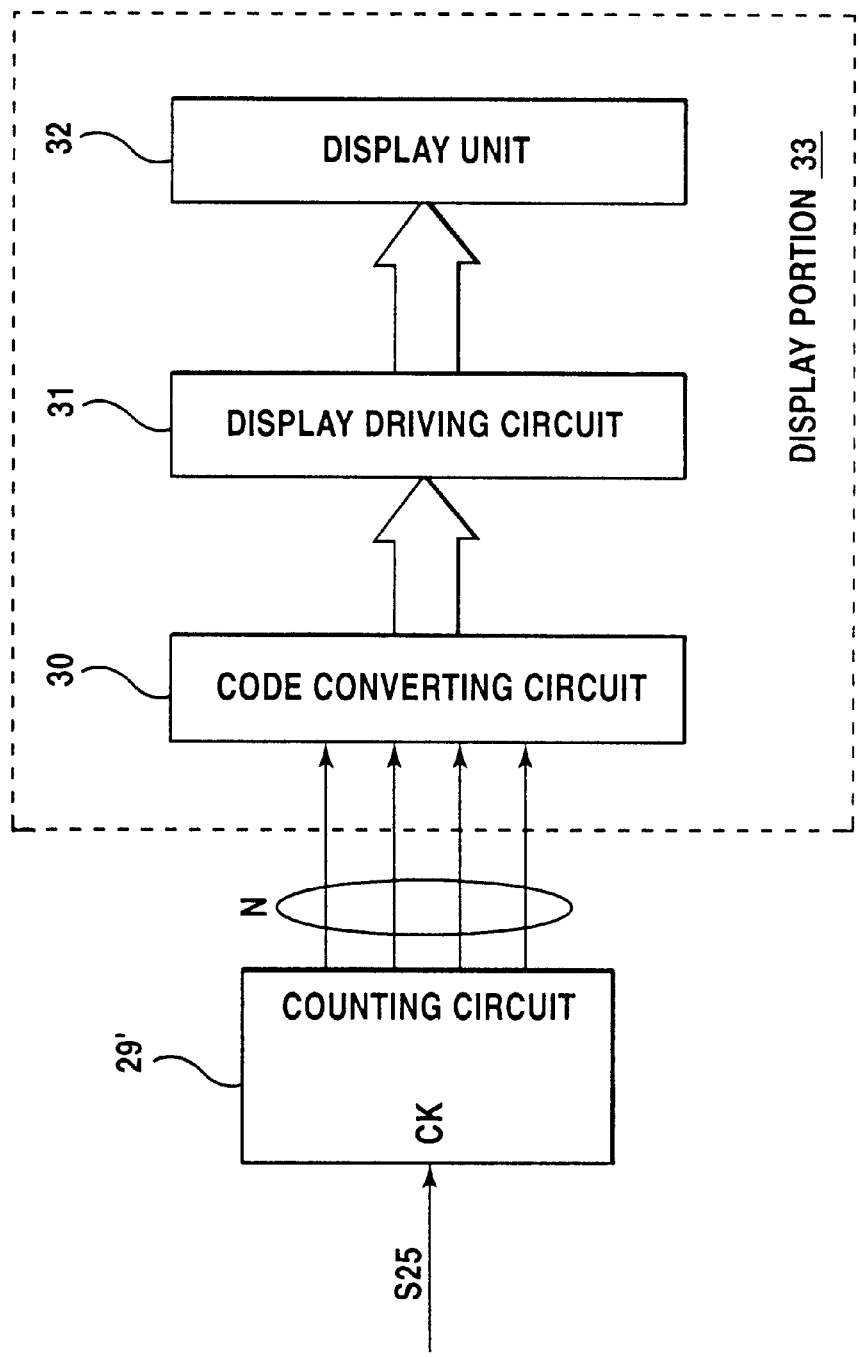
FIG. 14 is a block diagram showing an arrangement of charge monitoring means in the second embodiment.

Although the electronic watch of this embodiment has the same arrangement as the first embodiment as shown in FIG. 11, the former is different from the latter in that a clock means 4 does not produce a display pulse S33 and the power supply monitoring means 9' is structured as shown in FIG. 14. The power supply monitoring means 9' counts the stored power of a power supply cell 8 in response to a count pulse S25 from the clock means 4 and displays the counted value as the amount of stored power of the power supply cell 8.

Although the power supply monitoring means 9' has the same arrangement as the charge monitoring means 6' of the aforementioned embodiment shown in FIG. 10, the former is different from the latter in that a counting circuit 29', as shown in FIG. 14, has no control input terminal for switching between count-up and count-down operations but has a set terminal wherein if a set signal S0 is inputted to the set terminal, the counting circuit 29' sets a given counting value. The arrangement of a display portion 33 is the same as the display portion 33 shown in FIG. 10.

The set signal S0 is produced when the power supply cell 8 shown in FIG. 13 is replaced with another or the back of the case of the electric watch is opened or closed like in the first embodiment and a given counting value set by a first counting circuit 69 is set, for example, to be a value corresponding to the maximum value of 200 mAh of stored capacity of electric charge Q in the discharging characteristics of the silver cell shown in FIG. 17, namely, the maximum value at which the output bits are all brought "HIGH".

Explaining the operation of this embodiment, the amount of stored power of the power supply cell 8 is counted when the count pulse S25 is counted down from the maximum value by the counting circuit 29, and a counted value N becomes a binary output value representing the stored power. When the counted value N is inputted to the display portion 33, the stored power of the power supply cell 8 is digitally displayed by the display unit 32 such as a liquid crystal display in the same manner as in the aforementioned embodiment shown in FIG. 10.

Needless to say, the amount of stored power of the power supply cell 8 is not only digitally displayed with the seven segment display but also can be displayed in a cylindrical graph display.

Accordingly, the amount of stored power of the power supply cell can always be exactly displayed also in this embodiment, and hence it can be verified.

INDUSTRIAL APPLICABILITY

The electronic watch provided with the electric power generator and the charge means can always exactly display the amount of stored power of the charge means which is charged by power produced by the electric power generator, and the amount of stored power and operable period of the electronic watch thereby can be exactly known, thereby preventing a case where the amount of stored power of the charge means is exhausted so that the electronic watch does not operate while users are not aware of it.

That is, when the users verify the decrease of the stored power of the charge means by the display of the charge monitoring means, they can then increase the time that they wear the electronic watch on their arms or the time that the electronic watch is exposed to light so as to facilitate the generation of power by the electric power generator, so that the electronic watch can maintain its time operation stably for a long period of time.

Further, even in the electronic watch which is not provided with the electric power generator but operates by the power supply cell, the amount of stored power can always be exactly displayed by the power supply monitoring means, thereby preventing a case where the power supply cell is so fast replaced with another that a still usable cell is scrapped, or the chance for replacement of the cell is lost so that the electronic watch stops its operation.

Accordingly, the commercial value of the electronic watch can be remarkably enhanced.

What is claimed is:

1. An electronic watch comprising:

an electric power generator (1) for generating power by external energy;

charge means (3) for charging power which is generated by the electric power generator (1) through reverse current prevention means (2);

clock means (4) for executing time display operation by power of the generator (1) or charge means (3), and for generating a first count pulse (S14) so as to count the amount of power generated by the electric power generator (1), a second count pulse (S15) for counting the amount of consumption power of the charge means (3), a display pulse (S33) for displaying the amount of stored power of the charge means (3), and a switching signal pulse (S16) for switching between the first and second count pulses;

switching means (5) comprising a voltage detector (11) for detecting a power supply voltage of the electric power generator (1) and a charging voltage of the charge means (3), a pulse controlling circuit (12) for controlling the switching signal pulse (S16) in response to an output of the voltage detector (11), and a pulse selecting circuit (13) for selecting either of the first or second count pulses (S14) and (S15) in response to an output of the pulse controlling circuit (12); and charge monitoring means (6) which is controlled by the output of the pulse controlling circuit (12) of the switching means (5) for counting the amount of power stored in the charge means (3) in response to a count pulse (S19) selected by the pulse selecting circuit (13) so as to display the amount of stored power in response to the counted value and the display pulse (S33).

2. The electronic watch according to claim 1:

wherein the charge monitoring means (6) comprises:

a count controlling circuit (34) composed of a first counting circuit (39) having a clock input terminal for receiving the count pulse (S19) selected by the pulse selecting circuit (13) of the switching means (5) so as to execute a count-up operation or count-down operation in response to the output of the pulse controlling circuit (12), a second counting circuit (40) for executing a count-up operation or count-down operation so as to produce a counted value which is equal to the counted value of the first counting circuit (39), and a magnitude comparator (41) for comparing the magnitude of the counted value of the first counting circuit (39) with that of the second counting circuit (40) and outputting the result of comparison;

an operation switching circuit (37) for switching between the count-up operation and count-down operation of the second counting circuit (40) in response to the result of comparison of the magnitude comparator (41);

a pulse supplying circuit (36) for supplying the display pulse (S33) to a clock input terminal of the second counting circuit (40) in response to the result of comparison of the magnitude comparator (41);

a pulse generating circuit (35) for generating a driving pulse in response to the result of comparison of the magnitude comparator (41) and the display pulse (S33); and a display mechanism which is driven by the driving pulse to display the amount of stored power of the charge means (3).

3. The electronic watch according to claim 2:

wherein the display mechanism comprises a pulse motor (54) which is driven by the driving pulse and a discoid display plate (56) which is rotatably driven by the pulse motor (54), and wherein the display plate (56) is composed of a half semicircular portion (56a) and another half semicircular portion (56b) which are colored with different colors.

4. An electronic watch comprising:

an electric power generator (1) for generating power by external energy;

charge means (3) for charging power which is generated by the electric power generator (1) through reverse current prevention means (2);

clock means (4) for executing time display operation by power of the electric power generator (1) or charge means (3), and for generating a first count pulse (S14) so as to count the amount of power generated by the electric power generator (1), a second count pulse (S15) for counting the amount of consumption power of the charge means (3), and a switching signal pulse (S16) for switching between the first and second count pulses (S14) and (S15);

switching means (5) comprising a voltage detector (11) for detecting a power supply voltage of the electric power generator (1) and a charging voltage of the charge means (3), a pulse controlling circuit (12) for controlling the switching signal pulse (S16) in response to an output of the voltage detector (11), and a pulse selecting circuit (13) for selecting either of the first or second count pulses (S14) and (S15) in response to an output of the pulse controlling circuit (12); and charge monitoring means (6) which is controlled by the output of the pulse controlling circuit (12) of the switching means (5) for counting the amount of stored power of the charge means (3) in response to the count pulse selected by the pulse selecting circuit (13) so as to display the amount of power stored in the charge means (3) in response to the counted value.

5. The electronic watch according to claim 4:

wherein the charge monitoring means (6) comprises;

a display unit (32) for digitally displaying the amount of stored power of the charge means (3);

a counting circuit (29) for receiving the count pulse (S19) selected by the pulse selecting circuit (13) at its clock input terminal to execute a count-up operation or count-down operation in response to the output of the pulse controlling circuit (12), thereby outputting the result of counting as a binary output;

a code converting circuit (30) for converting the binary output value of the counting circuit (29) into a code capable of being digitally displayed; and a display driving circuit (31) for driving a display unit (32) in response to the code converted by the code converting circuit (30) to execute a digital display.

* * * * *